(12) United States Patent
Maki

(10) Patent No.: US 10,854,582 B2
(45) Date of Patent: Dec. 1, 2020

(54) LIGHT-EMITTING MODULE

(71) Applicant: TOSHIBA HOKUTO ELECTRONICS CORPORATION, Asahikawa (JP)

(72) Inventor: Keiichi Maki, Suita (JP)

(73) Assignee: Toshiba Hokuto Electronics Corporation, Asahikawa (JP)

(*) Notice: Subject to any disclaimer, the term of this patent is extended or adjusted under 35 U.S.C. 154(b) by 0 days.

(21) Appl. No.: 16/011,968

(22) Filed: Jun. 19, 2018

(65) Prior Publication Data

US 2018/0301437 A1    Oct. 18, 2018

Related U.S. Application Data

(63) Continuation of application No. PCT/JP2016/088318, filed on Dec. 22, 2016.

(30) Foreign Application Priority Data

Dec. 28, 2015  (JP) .................................. 2015-257166
Mar. 25, 2016  (JP) .................................. 2016-062160

(51) Int. Cl.
*H01L 25/075* (2006.01)
*H05K 1/11* (2006.01)
(Continued)

(52) U.S. Cl.
CPC .......... *H01L 25/0753* (2013.01); *H01L 33/56* (2013.01); *H05B 33/06* (2013.01); *H05K 1/118* (2013.01); *H05K 1/189* (2013.01); *H01L 33/62* (2013.01); *H01L 2933/0033* (2013.01); *H05K 1/147* (2013.01); *H05K 2201/0154* (2013.01); *H05K 2201/10128* (2013.01)

(58) Field of Classification Search
CPC ............................ H01L 25/0753; H01L 33/06
USPC .......................................................... 257/98
See application file for complete search history.

(56) References Cited

U.S. PATENT DOCUMENTS 7,321,496 B2   1/2008  Yamashita et al.
7,773,386 B2   8/2010  Yamashita et al.
(Continued)

FOREIGN PATENT DOCUMENTS

JP   2005-303274 A1   10/2005
JP   2010-212320 A1    9/2010
(Continued)

OTHER PUBLICATIONS

International Search Report and Written Opinion (Application No. PCT/JP2016/088318) dated May 9, 2017.
(Continued)

*Primary Examiner* — Long K Tran
(74) *Attorney, Agent, or Firm* — Burr & Brown, PLLC

(57) ABSTRACT

Disclosed is a light-emitting module including: a first insulation film having light transmissive property; a conductor layer provided on the first insulation film; a second insulation film disposed to face the first insulation film; a plurality of light-emitting elements interposed between the first insulation film and the second insulation film and have one surface on which a pair of electrodes connected to the conductor layer are provided; and a board that is connected to the first insulation film and has a circuit connected to the conductor layer.

24 Claims, 21 Drawing Sheets

(51) Int. Cl.
  *H01L 33/56*    (2010.01)
  *H05B 33/06*    (2006.01)
  *H05K 1/18*     (2006.01)
  *H05K 1/14*     (2006.01)
  *H01L 33/62*    (2010.01)

(56) References Cited

U.S. PATENT DOCUMENTS

| | | | |
|---|---|---|---|
| 2006/0115948 A1* | 6/2006 | Tokunaga | H01L 29/66757 438/299 |
| 2013/0107181 A1* | 5/2013 | Eguchi | H04N 9/3105 349/110 |
| 2015/0060905 A1 | 3/2015 | Nam et al. | |
| 2015/0117001 A1* | 4/2015 | Fan | F21V 23/001 362/235 |
| 2016/0204373 A1* | 7/2016 | Park | H01L 27/3244 257/40 |
| 2016/0276322 A1 | 9/2016 | Maki | |

FOREIGN PATENT DOCUMENTS

| | | |
|---|---|---|
| JP | 2012-084855 A1 | 4/2012 |
| WO | 2015/083366 A1 | 6/2015 |

OTHER PUBLICATIONS

Japanese Office Action (Application No. 2017-559161) dated May 12, 2020 (with English translation).

\* cited by examiner

LIGHT-EMITTING MODULE

CROSS-REFERENCE TO RELATED APPLICATIONS

This application is continuation of International Application No. PCT/JP2016/088318, filed on Dec. 22, 2016, which is based upon and claims the benefit of priority from the prior Japanese Patent Applications No. 2015-257166 filed on Dec. 28, 2015 and No. 2016-062160 filed on Mar. 25, 2016. The entire specifications, claims, and drawings of Japanese Patent Applications No. 2015-257166 and No. 2016-062160 are herein incorporated in this specification by reference.

FIELD

Embodiments of the invention relate to a light-emitting module.

BACKGROUND

In recent years, efforts for reducing energy consumption have been focused. On such a background, light-emitting diodes (LEDs) consuming relatively low power are attracting attention as next-generation light sources. The LED is compact, has a small heat radiation amount, and provides satisfactory responsiveness. Therefore, the LEDs are widely used for various optical devices. For example, recently, a module provided with LEDs disposed on a light transmissive substrate having flexibility and light transmissive property as a light source has been proposed. In this type of modules, a method of supplying power to the LEDs is a problem.

In particular, in a module provided with a plurality of LEDs as a light source, wiring on the light transmissive substrate on which LEDs are embedded is limited in order to secure light transmissive property. In particular, when the number of LEDs embedded on the module is large, it becomes difficult to form complicated wiring on the module.

DETAILED DESCRIPTION

A light-emitting module according to an embodiment of the invention includes a first insulation film having light transmissive property, a conductor layer provided on the first insulation film, a second insulation film disposed to face the first insulation film, a plurality of light-emitting elements that are interposed between the first insulation film and the second insulation film and have one surface on which a pair of electrodes are connected to the conductor layer, and a board that is connected to the first insulation film and has a circuit connected to the conductor layer.

An embodiment of the invention will now be described with reference to the accompanying drawings. In the following description, the XYZ coordinate system consisting of X, Y, and Z axes perpendicular to each other is employed.

Figure 1:
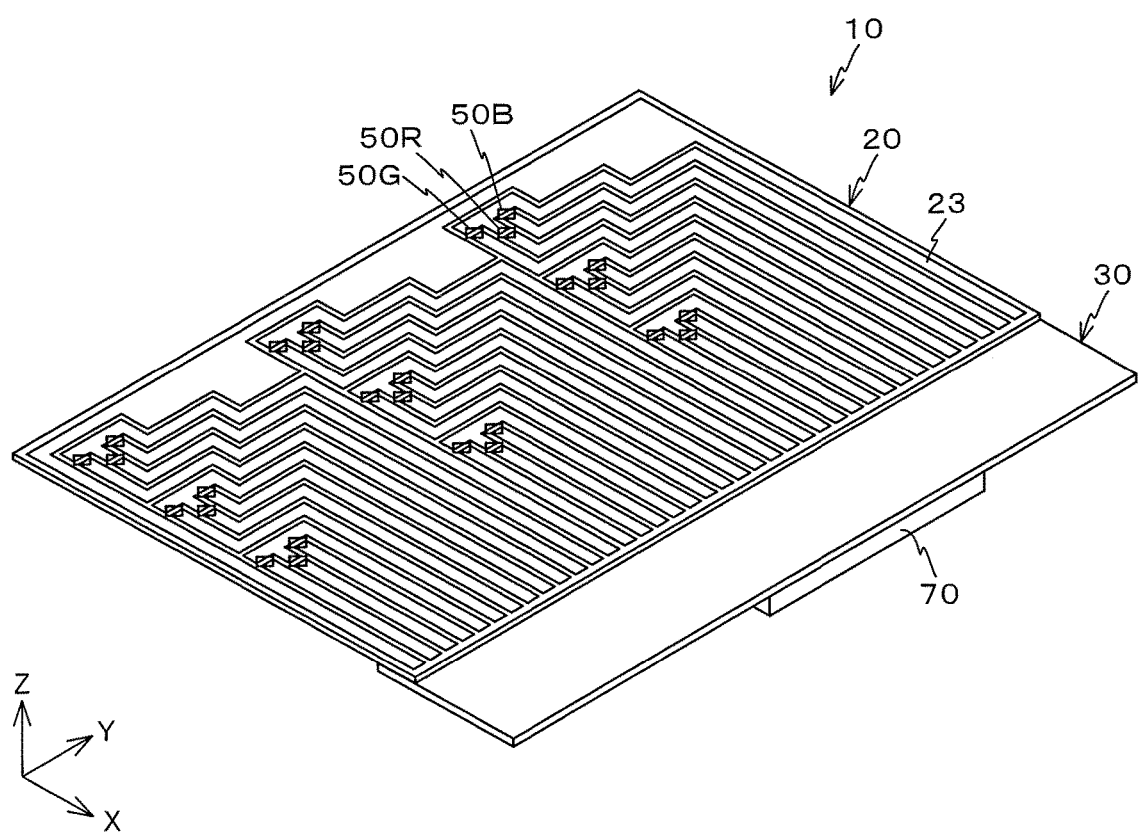
FIG. 1 is a perspective view illustrating a light-emitting module according to an embodiment of the invention.
Figure 2:
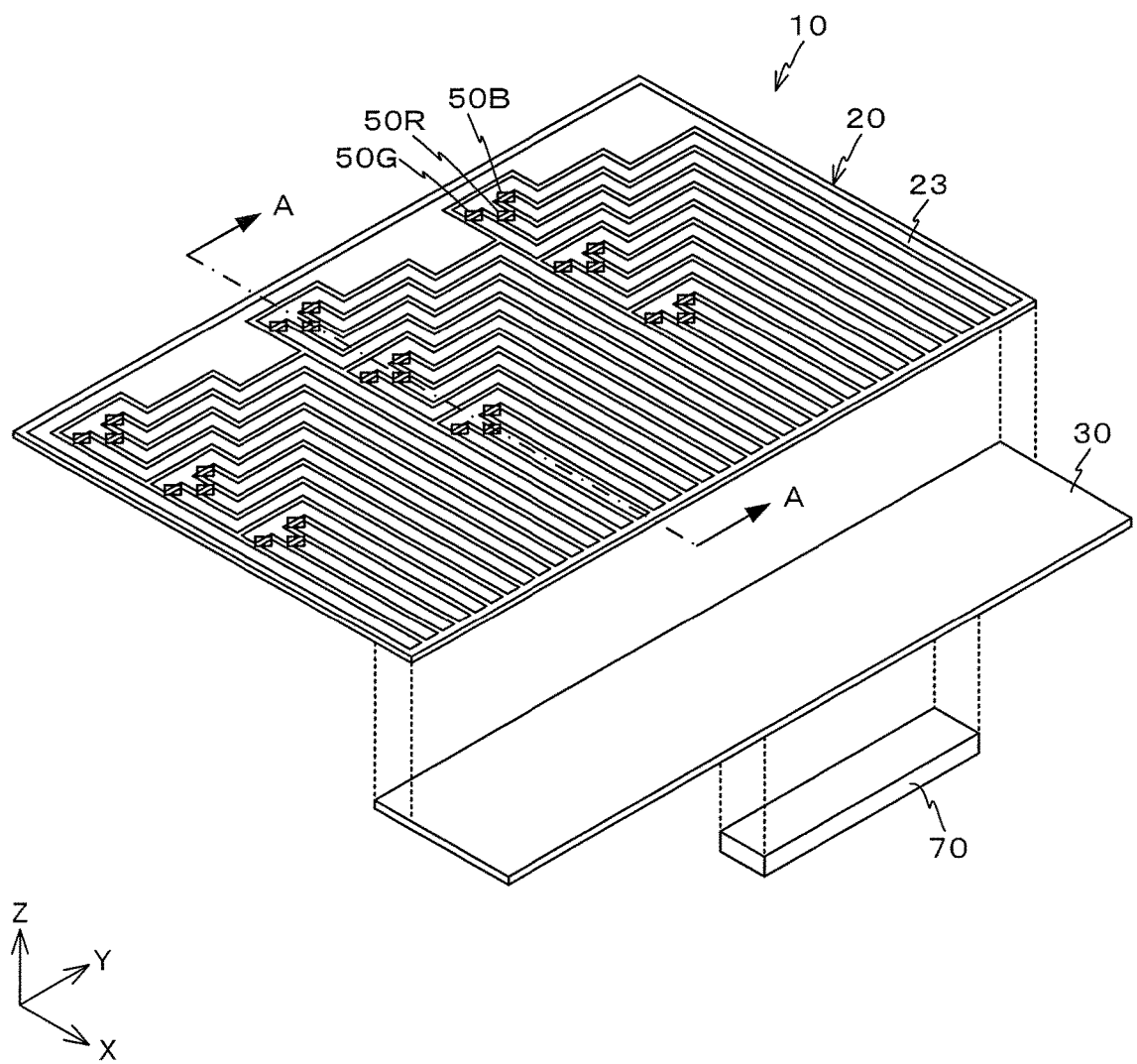
FIG. 2 is an exploded perspective view illustrating the light-emitting module.

FIG. 1 is a perspective view illustrating a light-emitting module 10 according to an embodiment of the invention. In addition, FIG. 2 is an exploded perspective view illustrating the light-emitting module 10. As illustrated in FIGS. 1 and 2, the light-emitting module 10 includes a light-emitting panel 20, a board 30 connected to the light-emitting panel 20, and a connector 70 embedded on the board 30. While FIGS. 1 and 2 illustrate the entire surface of the light-emitting panel 20, a vertical positional relationship between the light-emitting panel 20 and the board 30 may be set arbitrarily without limiting to those illustrated in the drawings. In the following embodiments, it is assumed that the board 30 is connected to a lower surface of an end portion of the light-emitting panel 20, and the connector 70 is embedded on a lower surface of the board 30. In addition, although the light-emitting panel 20 is nearly transparent as described below, the interconnects connected to the light-emitting elements 50R, 50G, and 50B are also illustrated as lines in FIGS. 1 and 2 for convenient description purposes. In FIGS. 1 and 2, the light-emitting elements 50R, 50G, and 50B are placed under the interconnect (refer to FIG. 3).

Figure 3:
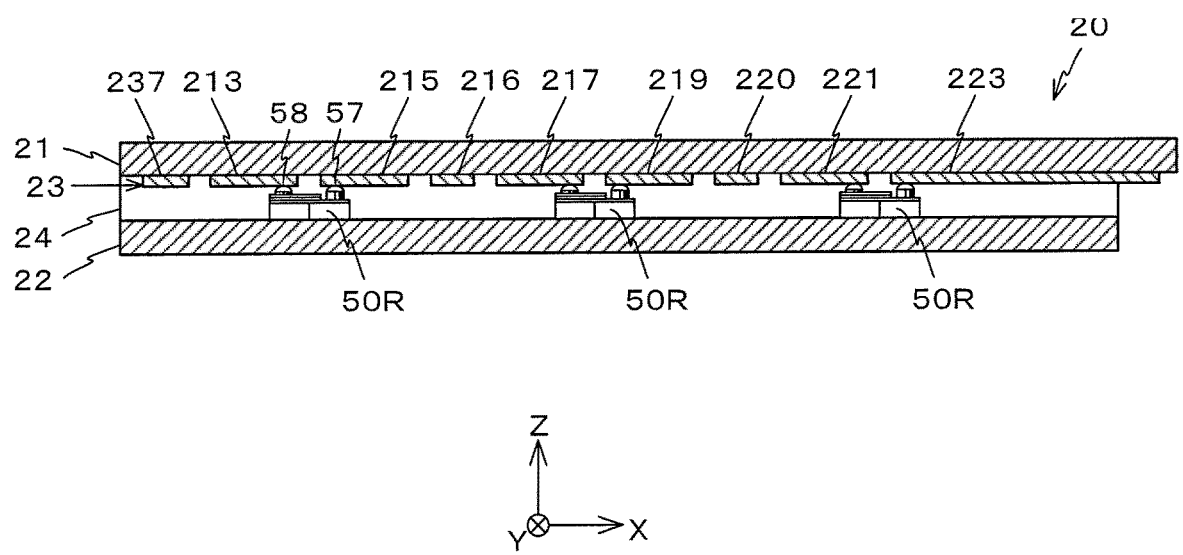
FIG. 3 is a diagram illustrating a cross section of the light-emitting panel.

The light-emitting panel 20 has an arbitrary shape. For example, the light-emitting panel 20 is a rectangular member having a longitudinal direction set to the Y-axis direction. The light-emitting panel 20 has three-colored light-emitting elements 50R, 50G, and 50B neighbored to each other as a light source. FIG. 3 is a diagram illustrating a cross section taken along a line A-A of the light-emitting panel 20 of FIG. 2. As illustrated in FIG. 3, the light-emitting panel 20 has a set of light transmissive films 21 and 22, a resin layer 24 formed between the light transmissive films 21 and 22, and light-emitting elements 50R, 50G, and 50B arranged inside the resin layer 24. Note that FIG. 3 illustrates only the light-emitting element 50R for simplicity purposes.

The light transmissive films 21 and 22 are rectangular films having a longitudinal direction set to the Y-axis direction. The light transmissive films 21 and 22 have a thickness of approximately 50 to 300 μm and transmit visible light. The light transmissive films 21 and 22 preferably have a total light transmittance of approximately 5 to 95%. The total light transmittance refers to a value measured on the basis of the Japanese Industrial Standard JIS K7375:2008.

The light transmissive films 21 and 22 have flexibility, and their flexural strengths are set to approximately 0 to 320 kgf/mm2 (excluding zero). The flexural strength is a value measured on the basis of the ISO 178 (JIS K7171:2008).

It is conceived that the light transmissive films 21 and 22 are formed of polyethylene terephthalate (PET), polyethylene naphthalate (PEN), polycarbonate (PC), polyethylene succinate (PES), ARTON, acrylic resin, or the like.

A conductor layer 23 having a thickness of approximately 0.05 to 10 μm is formed on a lower surface (the −Z-side surface in FIG. 3) of the light transmissive film 21 out of the set of light transmissive films 21 and 22. The conductor layer 23 is a deposition film or a sputtered film formed of a metallic material such as copper (Cu) or silver (Ag). The conductor layer 23 may be formed by bonding a metal film using an adhesive. In a case where the conductor layer 23 is a deposition film or a sputtered film, the conductor layer 23 has a thickness of approximately 0.05 to 2 μm. In a case where the conductor layer 23 is formed by bonding the metallic film, the conductor layer 23 has a thickness of approximately 2 to 10 μm or 2 to 7 μm. In the following embodiments, it is assumed that each conductor layer 23 includes a mesh pattern formed of a metallic material.

Figure 4:
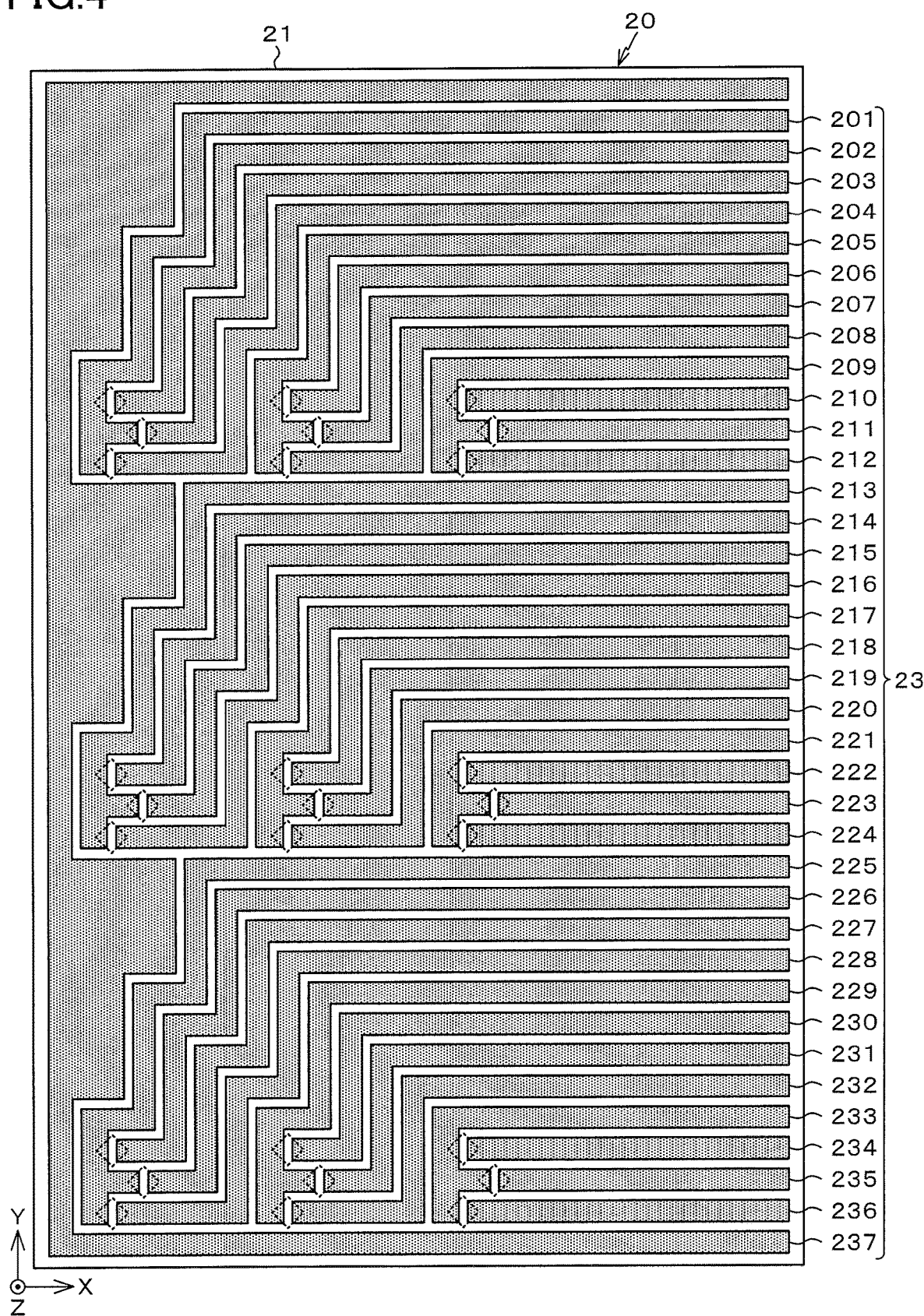
FIG. 4 is a plan view illustrating the light-emitting panel.

FIG. 4 is a plan view illustrating the light-emitting panel 20. As illustrated in FIG. 4, the conductor layer 23 is divided into, for example, thirty seven mesh patterns 201 to 237. Each of the mesh patterns 201 to 236 extends from the +X side end of the light transmissive film 21 across any one of the light-emitting elements 50R, 50G, and 50B. In addition, the mesh pattern 237 is provided along an outer edge of the −X side of the light transmissive film 21 and outer edges of both ends of the Y-axis direction.

Figure 5:
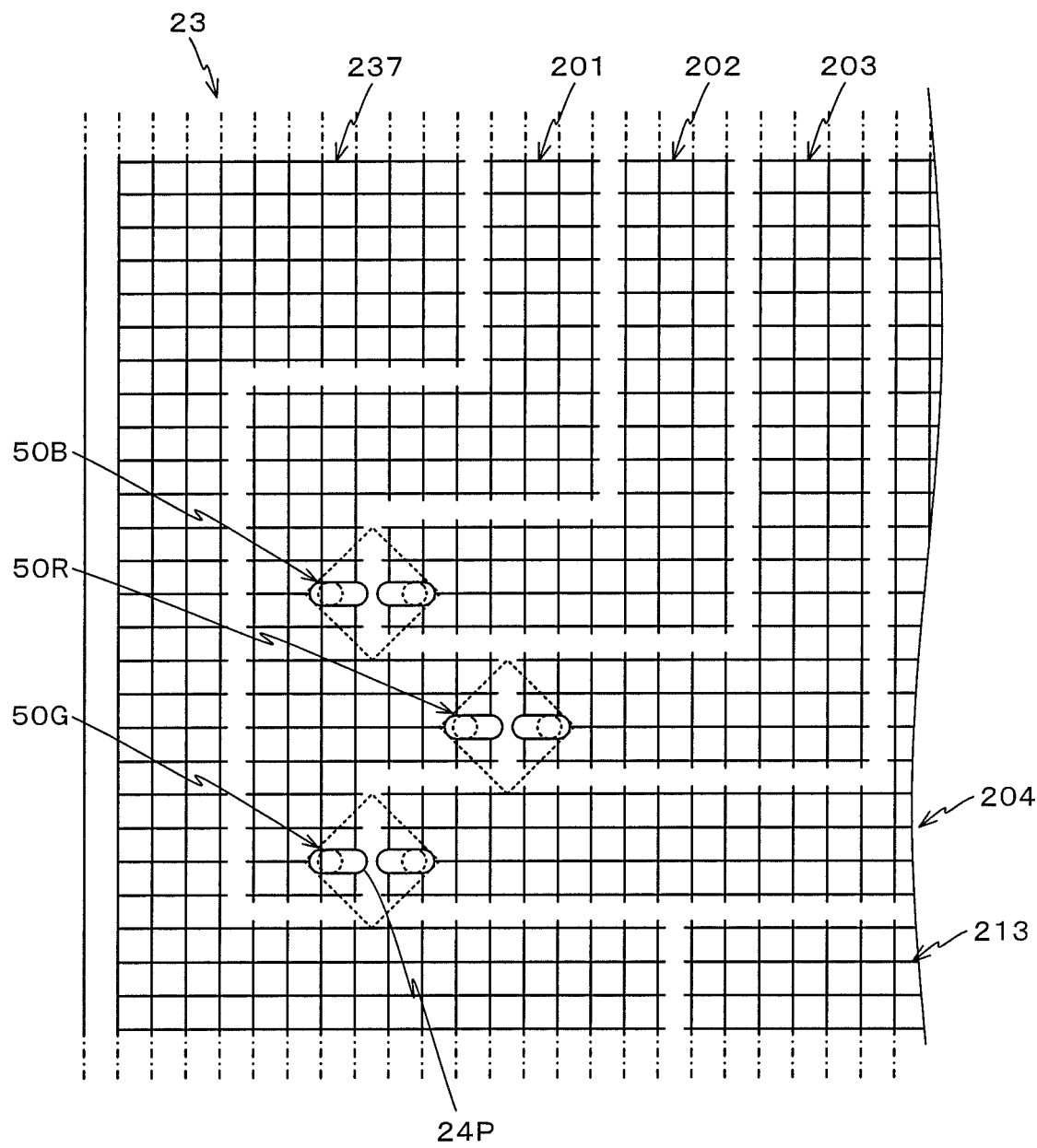
FIG. 5 is a partially enlarged view illustrating mesh patterns.
Figure 5:
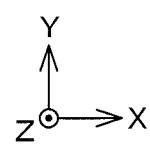

FIG. 5 is a partially enlarged view illustrating the mesh patterns 201 to 237. As illustrated in FIG. 5, the mesh patterns 201 to 237 are line patterns having a line width of approximately 10 μm. The line patterns extending in parallel with the X-axis are arranged with an interval of approximately 300 μm along the Y-axis. In addition, the line patterns extending in parallel with the Y-axis are arranged with an interval of approximately 300 μm along the X-axis. The mesh patterns 201 to 236 excluding the mesh pattern 237 have connection pads 24P to which the pads (electrodes) of the light-emitting elements 50R, 50G, and 50B are connected.

Each of the mesh patterns 201 to 237 is preferably translucent such that the light-emitting panel 20 as a whole has a total light transmittance equal to or higher than 1%. If the total light transmittance of the light-emitting panel 20 as a whole is lower than 1%, a light emission point is not recognized as a bright point. The mesh patterns 201 to 237 have different autonomous translucency depending on their configurations, but preferably have a total light transmittance of 10 to 85%.

As illustrated in FIG. 3, the lower light transmissive film 22 of the light-emitting panel 20 has a length of the X-axis direction shorter than that of the light transmissive film 21. For this reason, the +X-side ends of the mesh patterns 201 to 236 of the conductor layer 23 are exposed.

As illustrated in FIG. 3, the resin layer 24 is an insulator interposed between the light transmissive films 21 and 22. The resin layer 24 is formed of, for example, epoxy-based thermosetting resin having light transmissive property. The resin layer 24 preferably has a minimum melt viscosity VC1 of 10 to 10000 Pa·s at a temperature of 80 to 160° C. in a pre-cured state. In addition, a melt viscosity variation rate VR of the pre-cured state until the temperature reaches a temperature T1 of the minimum melt viscosity VC1 (lowest softening temperature) is preferably set to $\frac{1}{1000}$ or smaller. As the temperature of the resin layer 24 increases to T1 through heating, the viscosity of the resin layer 24 reaches the minimum melt viscosity VC1. Then, as the temperature of the resin layer 24 exceeds T1, the resin layer 24 is cured. The resin layer 24 preferably has a Vicat softening temperature T2 of 80 to 160° C. after the curing. The resin layer 24 preferably has a tensile storage elasticity modulus EM of 0.01 to 1000 GPa at a temperature of 0 to 100° C. In addition, the resin layer 24 preferably has a glass transition temperature T3 of 100 to 160° C.

The melt viscosity is a value obtained by changing the temperature of the measurement target from 50° C. to 180° C. on the basis of the standard JIS K7233. The Vicat softening temperature is a value obtained by setting a test load to 10 N and a temperature increase rate to 50° C./hour on the basis of the standard JIS K7206 (ISO 306:2004) A50. The melting temperature and the glass transition temperature are obtained by performing differential scanning calorimetry on the basis of the standard JIS K7121 (ISO 3146). The tensile storage elasticity modulus is a value obtained on the basis of the standard JIS K7244-1 (ISO 6721). Specifically, the tensile storage elasticity modulus is a value obtained through sampling at a frequency of 10 Hz using an automatic dynamic viscoelasticity meter for a measurement target whose temperature increases at a constant temperature increase rate of 1° C. per one minute from −100° C. to 200° C.

Each of the light-emitting elements 50R, 50G, and 50B is a square LED chip whose one side has a length of 0.1 to 3 mm. In the following description, the light-emitting elements 50R, 50G, and 50B will be collectively referred to as a light-emitting element 50 for convenient description purposes.

Figure 6:
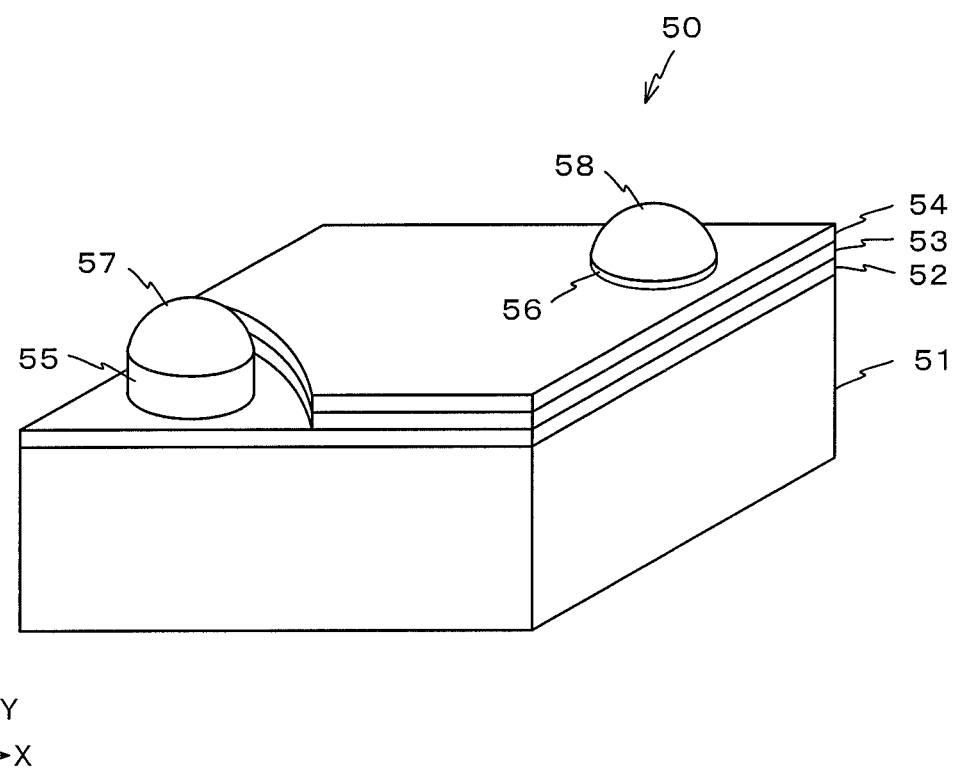
FIG. 6 is a perspective view illustrating a light-emitting element.

FIG. 6 is a perspective view illustrating the light-emitting element 50. As illustrated in FIG. 6, the light-emitting element 50 is an LED chip having a base board 51, an N-type semiconductor layer 52, an active layer 53, and a P-type semiconductor layer 54. The light-emitting element 50 has a rated voltage of approximately 2.5 V.

The base board 51 is a square plate-shaped board formed of, for example, sapphire. The N-type semiconductor layer 52 having the same shape as that of the base board 51 is formed on the upper surface of the base board 51. In addition, the active layer 53 and the P-type semiconductor layer 54 are laminated in this order on the upper surface of the N-type semiconductor layer 52.

The N-type semiconductor layer 52, the active layer 53, and the P-type semiconductor layer 54 are formed of a compound semiconductor material. As an active layer of a light-emitting element for emitting red light, for example, an InAlGaP-based semiconductor material is employed. In addition, for example, a GaN-based semiconductor material is employed in the P-type semiconductor layer 54 or the N-type semiconductor layer 52 of the light-emitting element emitting blue or green light, and an InGaN-based semiconductor material is employed in the active layer 53.

The active layer 53 and the P-type semiconductor layer 54 laminated on the N-type semiconductor layer 52 have notches formed in the corner between the −Y side and the −X side. The surface of the N-type semiconductor layer 52 is exposed from the notches of the active layer 53 and the P-type semiconductor layer 54.

An electrode 55 electrically connected to the N-type semiconductor layer 52 is formed in the area of the N-type semiconductor layer 52 exposed from the active layer 53 and the P-type semiconductor layer 54. In addition, an electrode 56 electrically connected to the P-type semiconductor layer 54 is formed in the corner between the +X side and the +Y side of the P-type semiconductor layer 54. The electrodes 55 and 56 are formed of copper (Cu) or gold (Au) and have bumps 57 and 58 formed on their upper surfaces. The bumps 57 and 58 are formed of a metallic material such as gold (Au) or gold alloy. The bumps 57 and 58 may be formed as solder bumps formed in a hemispheric shape instead of the metallic bump. The bump 57 of the light-emitting element 50 serves as a cathode electrode, and the bump 58 serves as an anode electrode.

According to this embodiment, the light-emitting element 50R emits red light. In addition, the light-emitting element 50G emits green light, and the light-emitting element 50B emits blue light. Specifically, the light-emitting element 50R emits light having a peak wavelength of approximately 600 to 700 nm. The light-emitting element 50G emits light having a peak wavelength of approximately 500 to 550 nm. The light-emitting element 50B emits light having a peak wavelength of approximately 450 to 500 nm.

As recognized from FIG. 5, each of the light-emitting elements 50R, 50G, and 50B is arranged between a pair of mesh patterns while the bumps 57 and 58 are connected to the connection pads 24P formed in the mesh patterns 201 to 236.

Figure 7:
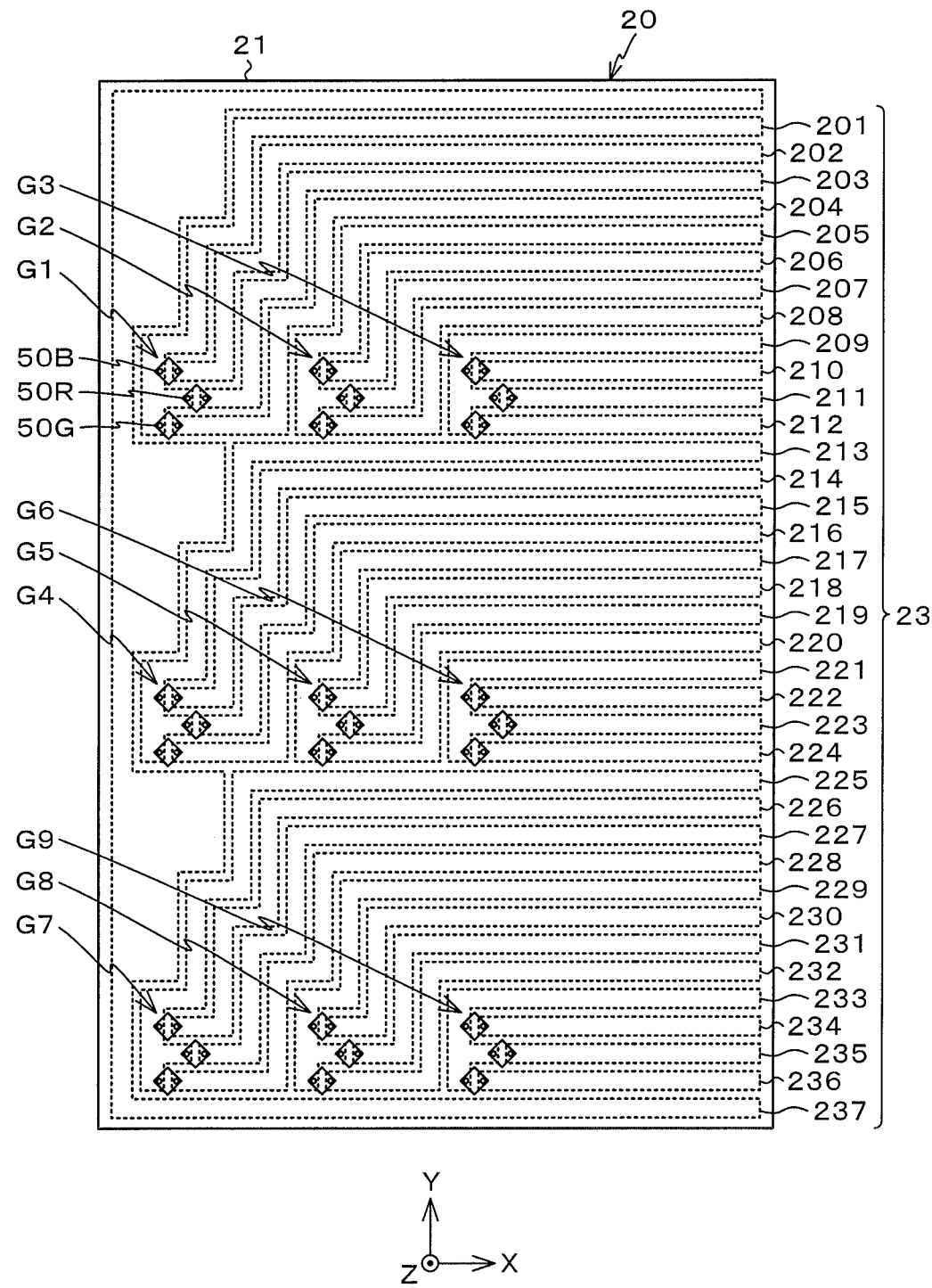
FIG. 7 is a diagram illustrating a positional relationship between the light-emitting elements and the mesh pattern.

FIG. 7 is a diagram illustrating a positional relationship between the light-emitting elements 50R, 50G, and 50B and the mesh patterns 201 to 237. As illustrated in FIG. 7, in the light-emitting panel 20, nine light-emitting element groups G1 to G9 each including three neighboring light-emitting elements 50R, 50G, and 50B are arranged in a 3×3 matrix shape.

In the light-emitting panel 20, the mesh pattern 201 is connected in series to the mesh patterns 202 to 204 through the light-emitting elements 50R, 50G, and 50B of the light-emitting element group G1. The mesh pattern 205 is connected in series to the mesh patterns 206 to 208 through the light-emitting elements 50R, 50G, and 50B of the light-emitting element group G2. The mesh pattern 209 is connected in series to the mesh patterns 210 to 212 through the light-emitting elements 50R, 50G, and 50B of the light-emitting element group G3. The mesh pattern 213 is connected in series to the mesh patterns 214 to 216 through the light-emitting elements 50R, 50G, and 50B of the light-emitting element group G4. The mesh pattern 217 is connected in series to the mesh patterns 218 to 220 through the light-emitting elements 50R, 50G, and 50B of the light-emitting element group G5. The mesh pattern 221 is connected in series to the mesh patterns 222 to 224 through the light-emitting elements 50R, 50G, and 50B of the light-emitting element group G6. The mesh pattern 225 is connected in series to the mesh patterns 226 to 228 through the light-emitting elements 50R, 50G, and 50B of the light-emitting element group G7. The mesh pattern 229 is connected in series to the mesh patterns 230 to 232 through the light-emitting elements 50R, 50G, and 50B of the light-emitting element group G8. The mesh pattern 233 is connected in series to the mesh patterns 234 to 236 through the light-emitting elements 50R, 50G, and 50B of the light-emitting element group G9. For this reason, it is possible to individually drive each of the light-emitting elements 50R, 50G, and 50B by selectively applying voltages to the mesh patterns of the light-emitting panel 20.

Figure 8:
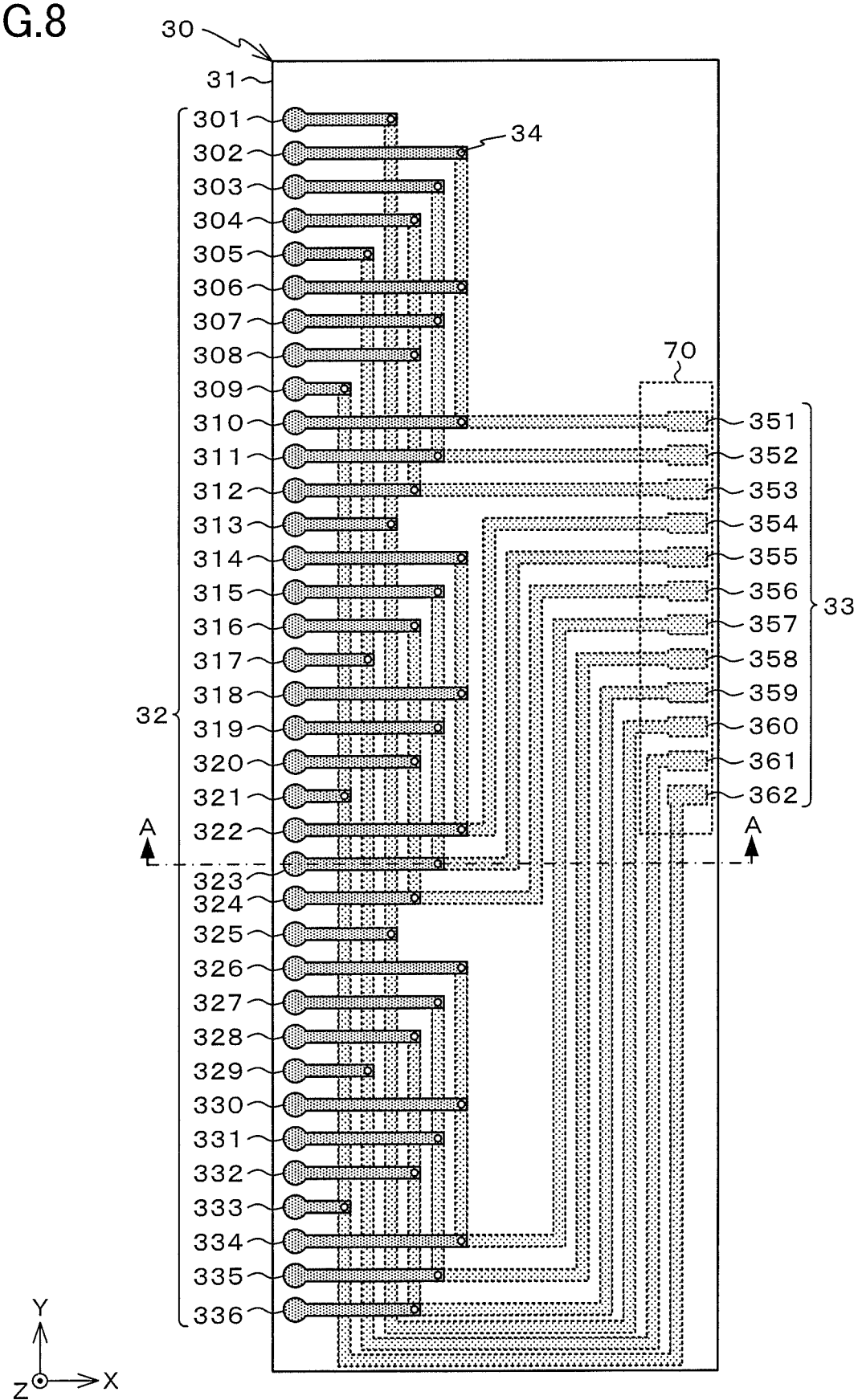
FIG. 8 is a plan view illustrating a board.

As illustrated in FIG. 2, the board 30 is a rectangular flexible board having a longitudinal direction set to the Y-axis direction. In this example, a flexible printed circuit (FPC) board is employed. The board 30 has an interconnect matrix, that is, a cross wiring pattern. In other words, the board 30 has a 3-dimensional interconnect pattern. In the following description, it is assumed that the board 30 is a multiplayer interconnection board having front and back interconnect layers. Alternatively, the board 30 may be a multilayer interconnection board having three or more interconnect layers. FIG. 8 is a plan view illustrating the board 30. As illustrated in FIG. 8, the board 30 has a conductor layer 32 formed on the upper surface (+Z side surface) and a conductor layer 33 formed on the lower surface (−Z side surface).

Figure 9:
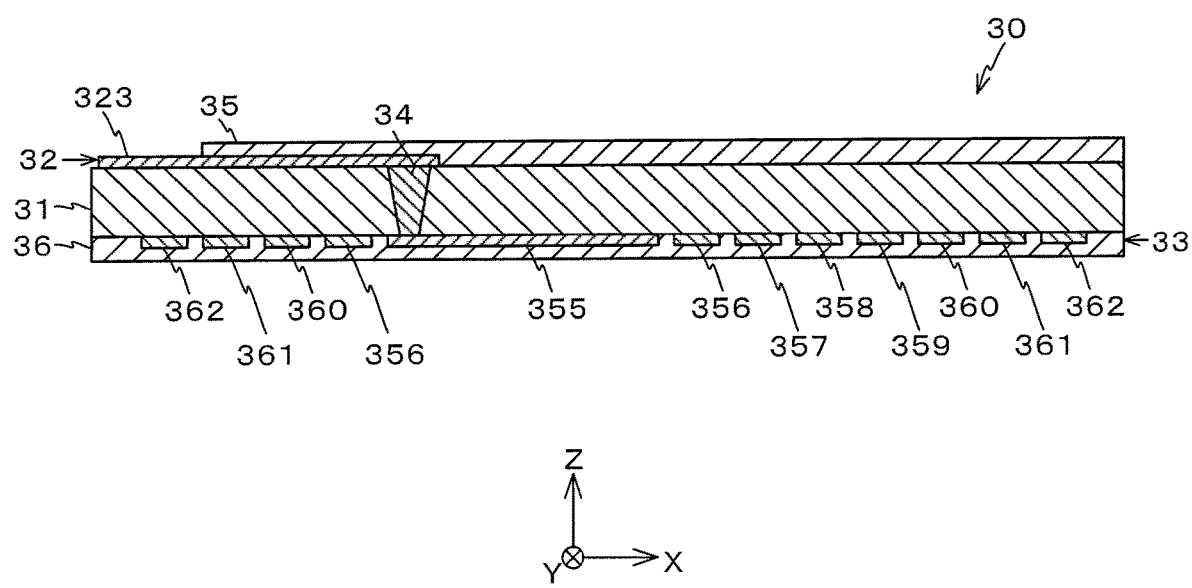
FIG. 9 is a cross-sectional view illustrating the board.

FIG. 9 is a cross-sectional view of the board 30 taken along the line A-A of FIG. 8. As illustrated in FIG. 9, the board 30 has a substrate 31 having the conductor layers 32 and 33, an insulation sheet 35 attached to the upper surface of the substrate 31, and an insulation sheet 36 attached to the lower surface of the substrate 31.

The substrate 31 is formed of, for example, polyimide having insulation and flexibility, and has the conductor layer 32 formed on its upper surface and the conductor layer 33 formed on its lower surface. For example, the substrate 31 may be manufactured from a copper clad laminate obtained by attaching copper films on its both surfaces.

Specifically, the board 30 having the conductor layers 32 and 33 can be manufactured by preparing a copper clad laminate having the same size as that of the board 30 and patterning the copper films attached on the front and back surfaces of the copper clad laminate.

As illustrated in FIG. 8, the conductor layer 32 provided on the upper surface of the substrate 31 has thirty six conductor patterns 301 to 336 extending in parallel with the X-axis. Each of the conductor patterns 301 to 336 matches each of the mesh patterns 201 to 236 of the light-emitting panel 20 and extends from the −X-side end of the substrate 31 to the +X direction.

The conductor layer 33 provided on the lower surface of the substrate 31 is a pattern used to lead the conductor patterns 301 to 336 to the +X-side side end of the substrate 31. The conductor layer 33 includes twelve conductor patterns 351 to 362.

The conductor pattern 351 has one side connected to the conductor patterns 302, 306, and 310 through a via 34 provided in the substrate 31 and the other side led to the +X side end of the substrate 31. The via 34 is an electrical connection formed in a through-hole. The via 34 is a plated film formed on an inner wall surface of a through-hole of the substrate 31, a conductor filled in the through-hole, or the like. The conductor pattern 352 has one side connected to the conductor patterns 303, 307, and 311 through the via 34 of the substrate 31 and the other side led to the +X side end of the substrate 31. The conductor pattern 353 has one side connected to the conductor patterns 304, 308, and 312 through the via 34 of the substrate 31 and the other side led to the +X side end of the substrate 31. The conductor pattern 354 has one side connected to the conductor patterns 314, 318, and 322 through the via 34 of the substrate 31 and the other side led to the +X side end of the substrate 31. The conductor pattern 355 has one side connected to the conductor patterns 315, 319, and 323 through the via 34 of the substrate 31 and the other side led to the +X side end of the substrate 31. The conductor pattern 356 has one side connected to the conductor patterns 316, 320, and 324 through the via 34 of the substrate 31 and the other side led to the +X side end of the substrate 31. The conductor pattern 357 has one side connected to the conductor patterns 326, 330, and 334 through the via 34 of the substrate 31 and the other side led to the +X side end of the substrate 31. The conductor pattern 358 has one side connected to the conductor patterns 327, 331, and 335 through the via 34 of the substrate 31 and the other side led to the +X side end of the substrate 31. The conductor pattern 359 has one side connected to the conductor patterns 328, 332, and 336 through the via 34 of the substrate 31 and the other side led to the +X side end of the substrate 31. The conductor pattern 360 has one side connected to the conductor patterns 301, 313, and 325 through the via 34 of the substrate 31 and the other side led to the +X side end of the substrate 31. The conductor pattern 361 has one side connected to the conductor patterns 305, 317, and 329 through the via 34 of the substrate 31 and the other side led to the +X side end of the substrate 31. The conductor pattern 362 has one side connected to the conductor patterns 309, 321, and 333 through the via 34 of the substrate 31 and the other side led to the +X side end of the substrate 31.

Rectangular electrode pads are formed in the +X side end of each of the conductor patterns 351 to 362 to connect a terminal provided in the connector 70.

Returning to FIG. 9, the insulation sheets 35 and 36 are formed of, for example, polyimide in the same size as that of the substrate 31. The insulation sheets 35 and 36 are bonded to the substrate 31 to coat the conductor layers 32 and 33. The insulation sheet 35 has an X-axis directional length shorter than that of the substrate 31. For this reason, the −X-side end of the conductor layer 32 of the board 30 is exposed to the outside. The board 30 configured as described above has flexibility higher than that of the light-emitting panel 20.

As illustrated in FIG. 1, the connector 70 is a part having a longitudinal direction set to the Y-axis direction. The connector 70 has terminals connected to the conductor patterns 351 to 362 of the board 30. As illustrated in FIG. 8, the connector 70 is embedded on the lower surface (−Z-side surface) of the board 30 while overlapping with the electrode pads of the conductor patterns 351 to 362. Since the connector 70 is embedded, it is possible to electrically connect an external device and the light-emitting module 10 to each other through the connector 70.

Figure 10:
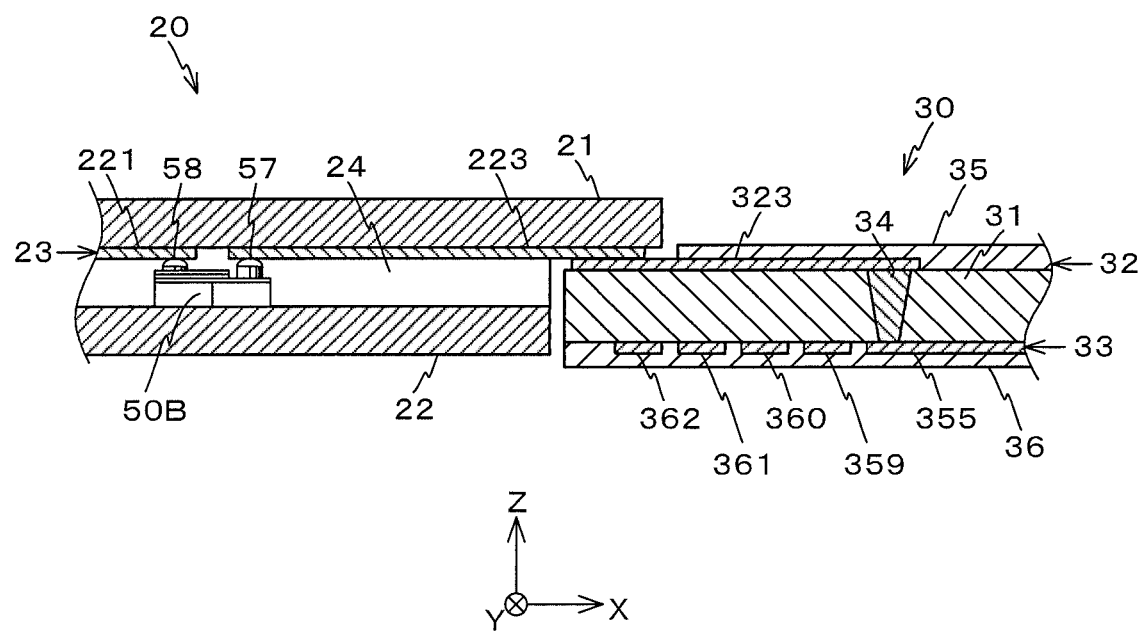
FIG. 10 is a diagram illustrating a bonding portion between the light-emitting panel and the board.

As recognized from FIG. 10, the light-emitting panel 20 and the board 30 are integrated to each other by bonding the lower surface of the light transmissive film 21 of the light-emitting panel 20 and the upper surface of the substrate 31 of the board 30 with an anisotropic conductive material obtained by dispersing conductive particles in resin. In addition, as the light-emitting panel 20 and the board 30 are pressed, the conductor layer 23 exposed from the +X-side end of the light-emitting panel 20 and the conductor layer 32 exposed from the −X-side end of the board 30 are electrically connected to each other by interposing conductive particles included in the anisotropic conductive material. When the conductor layer 23 of the light-emitting panel 20 and the conductor layer 32 of the board 30 are connected to each other, the mesh patterns 201 to 236 of the conductor layer 23 of the light-emitting panel 20 are connected to the conductor patterns 301 to 336, respectively, of the conductor layer 23 of the board 30.

Note that the anisotropic conductive material may include an anisotropic conductive film, an anisotropic conductive paste, or the like. These materials may also be referred to as an anisotropic conductive adhesive. According to this embodiment, the anisotropic conductive material has a film shape. However, the anisotropic conductive material is not limited thereto.

Figure 11:
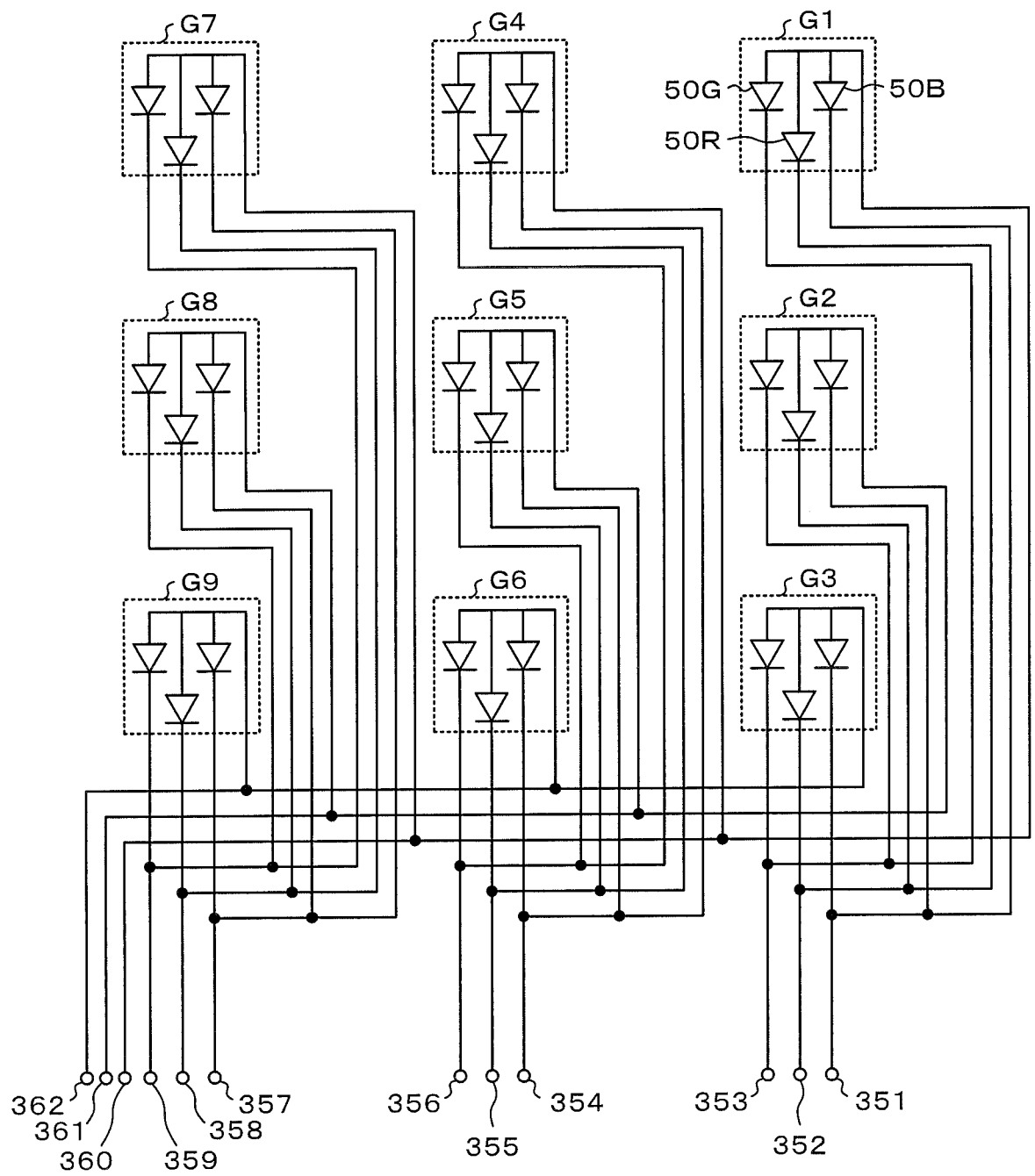
FIG. 11 is a circuit diagram of the light-emitting module.

FIG. 11 is a circuit diagram of the light-emitting module 10. As recognized from FIG. 11, as the light-emitting panel 20 and the board 30 are connected to each other, the light-emitting elements 50R, 50G, and 50B of each of the light-emitting element groups G1 to G9 are connected to the conductor patterns 351 to 362 of the conductor layer 33 of the board 30. In the light-emitting module 10, the conductor patterns 360, 361, and 362 are commonly connected to the anodes of the light-emitting elements 50R, 50G, and 50B of the light-emitting element groups G1, G2, and G3. In addition, the conductor patterns 352, 353, and 351 are connected to the cathodes of the light-emitting elements 50R, 50G, and 50B of the light-emitting element groups G1, G2, and G3.

Similarly, the conductor patterns 360, 361, and 362 are commonly connected to the anodes of the light-emitting elements 50R, 50G, and 50B of the light-emitting element groups G4, G5, and G6. In addition, the conductor patterns 355, 356, and 354 are connected to the cathodes of the light-emitting elements 50R, 50G, and 50B of the light-emitting element groups G4, G5, and G6. Similarly, the conductor patterns 360, 361, and 362 are commonly connected to the anodes of the light-emitting elements 50R, 50G, and 50B of the light-emitting element groups G7, G8, and G9. In addition, the conductor patterns 358, 359, and 357 are connected to the cathodes of the light-emitting elements 50R, 50G, and 50B of the light-emitting element groups G7, G8, and G9.

For this reason, the light-emitting elements 50R, 50G, and 50B of the light-emitting element groups G1 to G9 can be individually turned on or off by selectively applying voltages between the conductor patterns 360 to 362 and the conductor patterns 351 to 359. For example, a voltage may be applied between the conductor pattern 360 and the conductor pattern 352 in order to turn on the light-emitting element 50R of the light-emitting element group G1. In addition, a voltage may be applied between the conductor pattern 361 and the conductor pattern 356 in order to turn on the light-emitting element 50G of the light-emitting element group G5. In this manner, it is possible to turn on a desired light-emitting element by appropriately applying a voltage to a set of conductor patterns.

Next, a method of manufacturing the aforementioned light-emitting module 10 will be described. First, the light-emitting panel 20 is manufactured. Then, the board 30 having the conductor patterns 301 to 336 and 351 to 362 are connected to the light-emitting panel 20, so that the light-emitting module 10 is completed.

Figure 12:
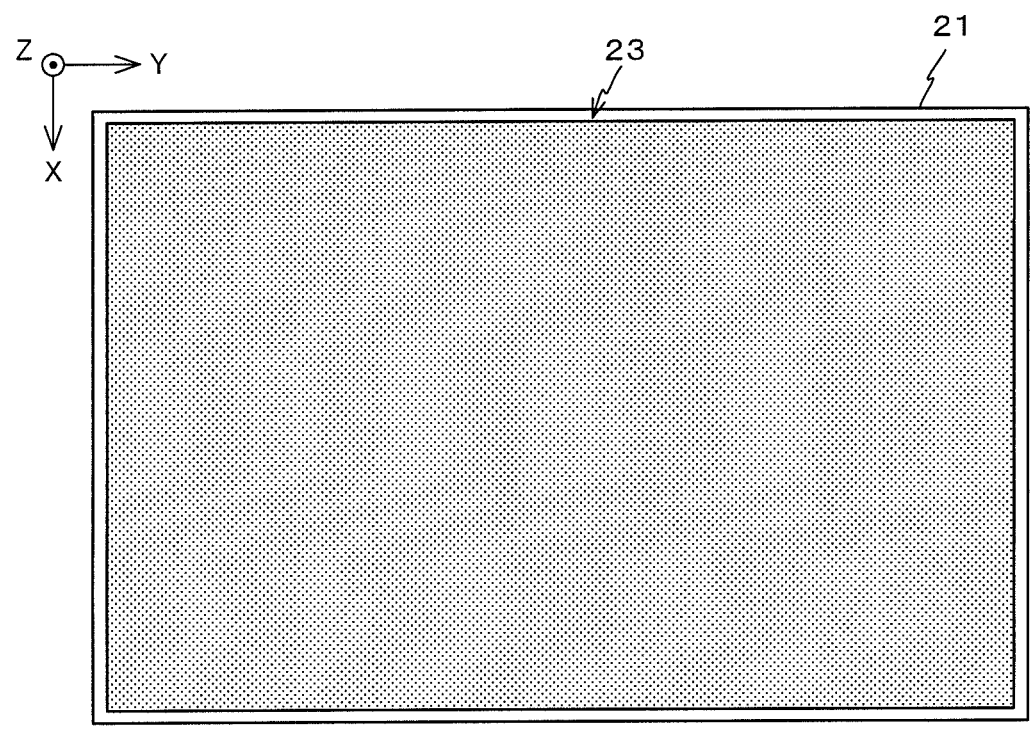
FIG. 12 is a diagram illustrating a method of manufacturing a light-emitting panel.
Figure 13:
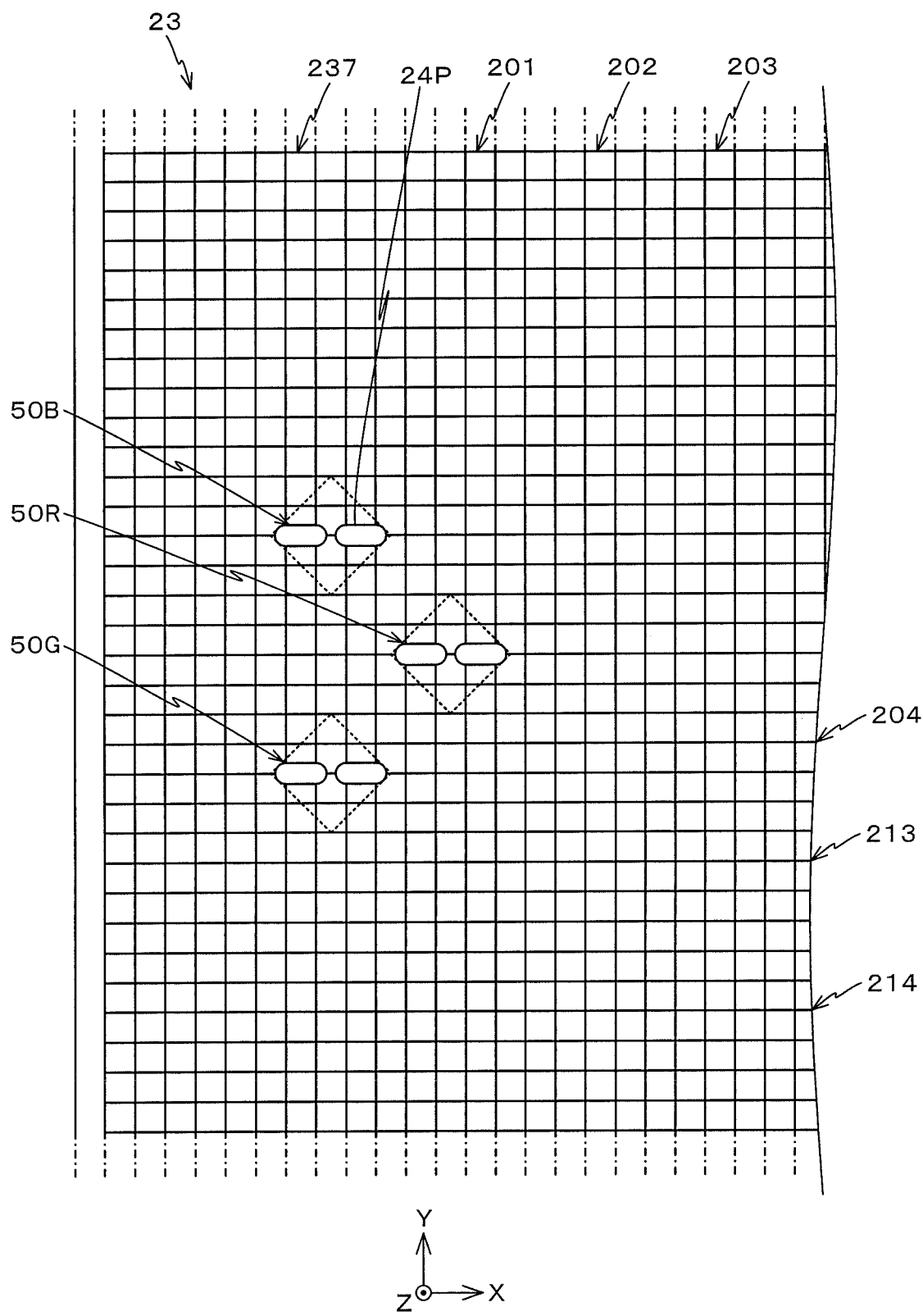
FIG. 13 is a diagram illustrating a method of manufacturing a light-emitting panel.

In order to manufacture the light-emitting panel 20, first, a light transmissive film 21 formed of PET is prepared. In addition, as illustrated in FIG. 12, a mesh-shaped conductor layer 23 is formed on the entire surface of the light transmissive film 21 through a subtract process, an additive process, or the like. FIG. 13 is a partially enlarged view illustrating the conductor layer 23. As illustrated in FIG. 13, in this case, the portions corresponding to the mesh patterns 201 to 237 are integrally formed in the conductor layer 23. Furthermore, the connection pads 24P are formed in parts of the conductor layer 23 where the light-emitting elements 50R, 50G, and 50B are embedded.

Figure 14:
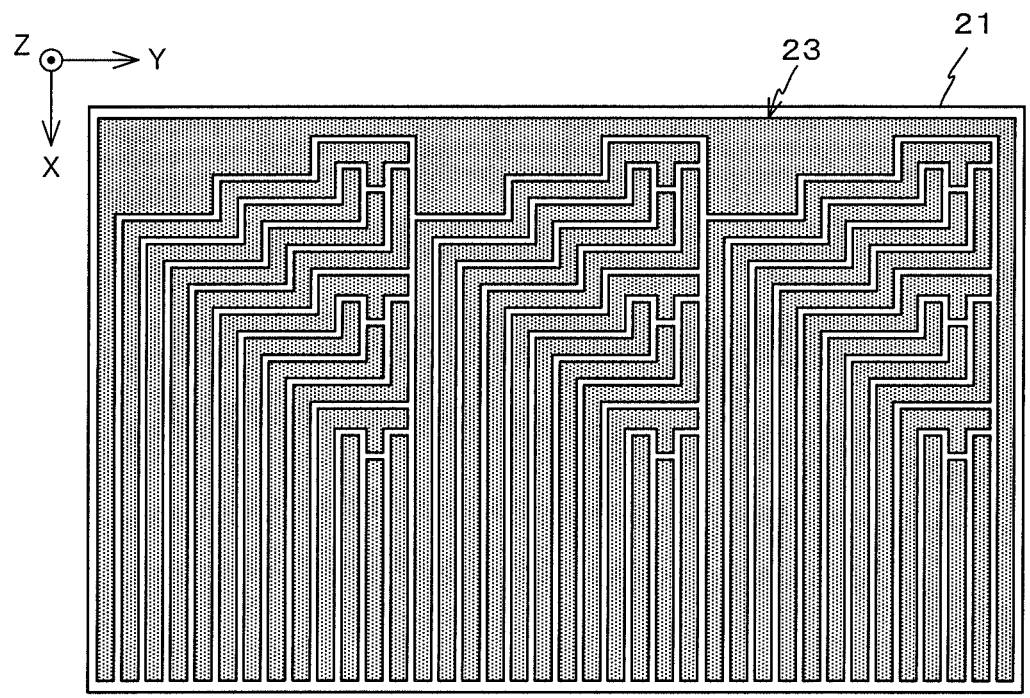
FIG. 14 is a diagram illustrating a method of manufacturing a light-emitting panel.

Then, the mesh patterns 201 to 237 are formed by cutting the conductor layer 23. The conductor layer 23 is cut, for example, using energy beam such as laser light. In a case where the energy beam is used, the energy beam is irradiated onto the conductor layer 23 formed in the light transmissive film 21, and the laser spot of the energy beam is shifted on the surface of the conductor layer 23. Through this process, the conductor layer 23 is cut as illustrated in FIG. 14 to form the mesh patterns 201 to 237.

Figure 15:
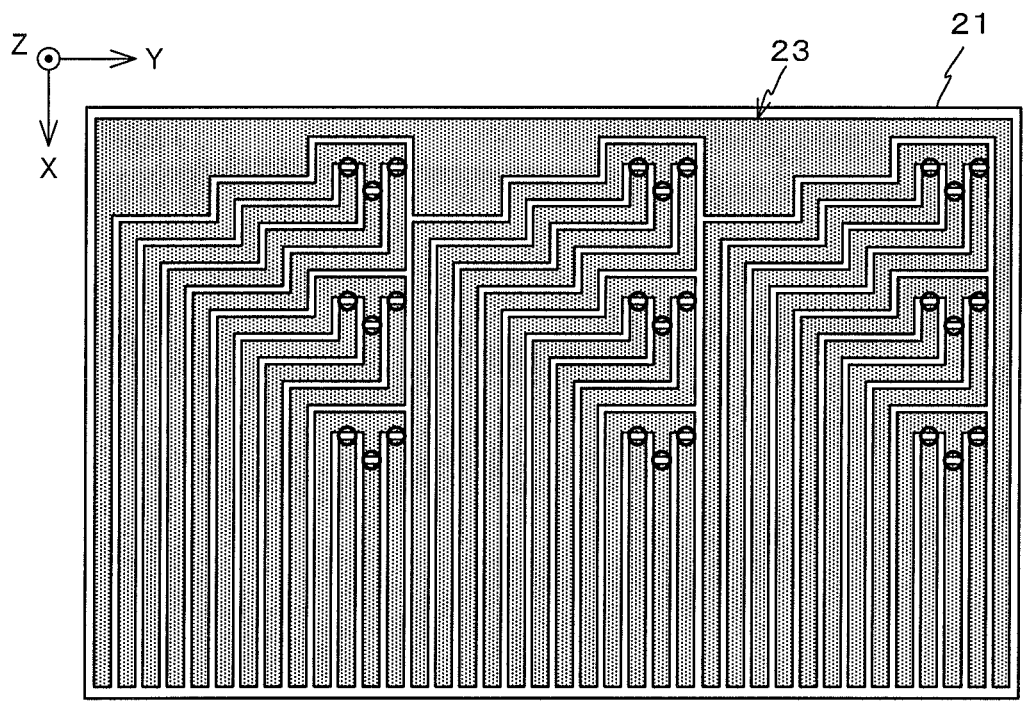
FIG. 15 is a diagram illustrating a method of manufacturing a light-emitting panel.

As the laser spot of the energy beam is shifted on the surface of the conductor layer 23, the portions around the laser spot shift path are melted and sublimated. As a result, the mesh patterns 201 to 237 are patterned, and the neighboring connection pads 24P are electrically isolated from each other as illustrated in FIG. 5. In the light-emitting module 10, a pair of connection pads 24P are formed in a circled portion of FIG. 15.

Figure 16:
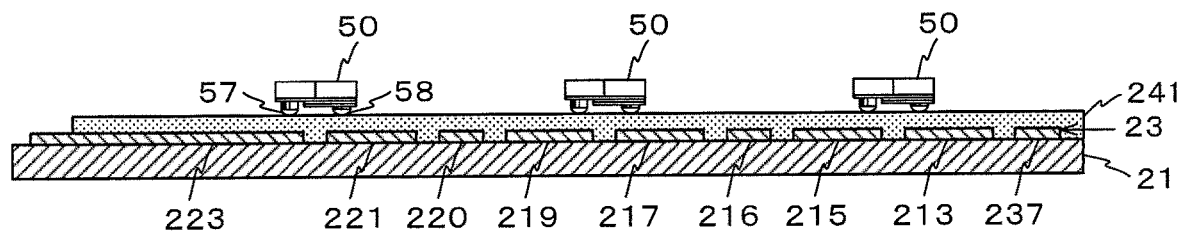
FIG. 16 is a diagram illustrating a method of manufacturing a light-emitting panel.
Figure 16:
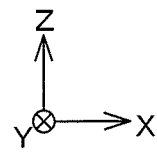

Then, thermosetting resin 241 is applied on the surface of the light transmissive film 21 having the mesh patterns 201 to 237 as illustrated in FIG. 16. The thermosetting resin 241 has a thickness nearly equal to the height of the bump 57 or 58 of the light-emitting element 50. The thermosetting resin 241 is a film-shaped member and is arranged on the surface of the light transmissive film 21. The thermosetting resin 241 includes, for example, epoxy-based resin.

Then, the light-emitting elements 50 are placed over the thermosetting resin 241. In this case, the light-emitting elements 50 are positioned such that the connection pads 24P formed in the mesh patterns 201 to 236 are placed immediately under the bumps 57 and 58 of the light-emitting elements 50.

Figure 17:
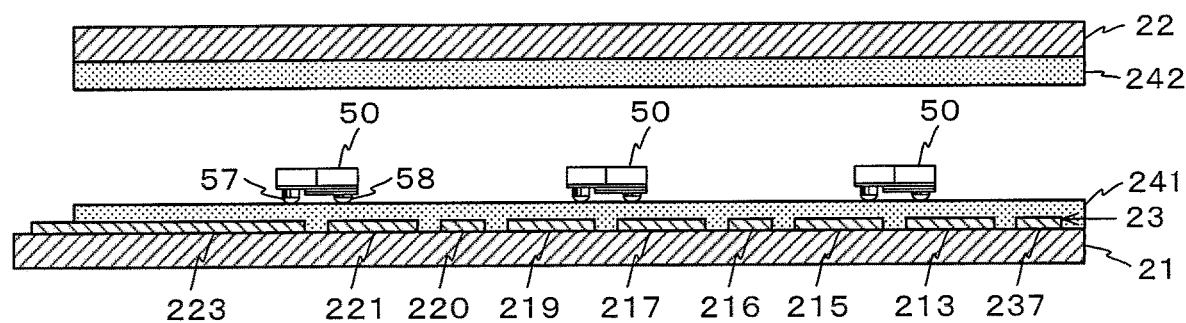
FIG. 17 is a diagram illustrating a method of manufacturing a light-emitting panel.
Figure 17:
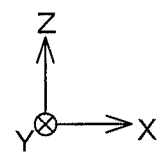

Then, as illustrated in FIG. 17, the light transmissive film 22 having film-shaped thermoplastic resin 242 attached on its lower surface is arranged over the upper surface side of the light transmissive film 21. The thermoplastic resin 242 includes, for example, acrylic elastomer.

Then, the light transmissive films 21 and 22 are bonded while they are heated under a vacuum atmosphere. As a result, first, the bumps 57 and 58 formed in the light-emitting elements 50 penetrate the thermosetting resin 241 to reach the conductor layer 23 and are electrically connected to each of the mesh patterns 201 to 236. In addition, the thermoplastic resin 242 softened through heating is filled around the light-emitting elements 50 without a gap, and the thermosetting resin 241 is cured. As a result, the thermosetting resin 241 and the thermoplastic resin 242 constitute the resin layer 24 that holds the light-emitting elements 50 between the light transmissive films 21 and 22 as illustrated in FIG. 3. Through the aforementioned processes, the light-emitting panel 20 is completed.

Then, as recognized from FIG. 10, the board 30 embedded with the connector 70 is connected to the completed light-emitting panel 20. In order to connect the light-emitting panel 20 and the board 30, the light-emitting panel 20 and the board 30 are positioned such that mesh patterns 201 to 236 exposed from the +X-side end of the light-emitting panel 20 face the conductor patterns 301 to 336 of the board 30. In addition, the light-emitting panel 20 and the board 30 are hot-pressed while the film-shaped anisotropic conductive material is interposed between the lower surface of the light transmissive film 21 of the light-emitting panel 20 and the upper surface of the board 30.

Through the hot pressing, the mesh patterns 201 to 236 of the light-emitting panel 20 and the conductor patterns 301 to 336 of the board 30 are electrically connected to each other by interposing conductive particles contained in the anisotropic conductive material. In addition, the light transmissive film 21 of the light-emitting panel 20 and the substrate 31 of the board 30 are bonded to each other with the resin of the anisotropic conductive material. As a result, the light-emitting panel 20 and the board 30 are integrated to each other, so that the light-emitting module 10 is completed.

As described above, the light-emitting module 10 according to this embodiment is a multilayer interconnection board because the board 30 has a pair of conductor layers 32 and 33. For this reason, the interconnects connected to the light-emitting elements 50R, 50G, and 50B of the light-emitting element groups G1 to G9 can be three-dimensionally led in the board 30. Therefore, it is possible to commonalize the interconnects to the light-emitting elements 50R, 50G, and 50B between the light-emitting elements 50R, 50G, and 50B, and improve connectability between the light-emitting module 10 and an external device.

For example, the board 30 of the light-emitting module 10 has a two-layered structure including the conductor layers 32 and 33. For this reason, the three input lines to the anodes of the light-emitting elements 50R, 50G, and 50B of the light-emitting element groups G1, G4, and G7 can be commonalized into a single conductor pattern 360. Similarly, the three input lines to the anodes of the light-emitting elements 50R, 50G, and 50B of the light-emitting element groups G2, G5, and G8 can be commonalized into a single conductor pattern 361. Furthermore, the three input lines to the anodes of the light-emitting elements 50R, 50G, and 50B of the light-emitting element groups G3, G6, and G9 can be commonalized into a single conductor pattern 362.

The nine output lines from the cathodes of the light-emitting elements 50R, 50G, and 50B of the light-emitting element groups G1, G2, and G3 can be commonalized into the three conductor patterns 351, 352, and 353. Similarly, the nine output lines from the cathodes of the light-emitting elements 50R, 50G, and 50B of the light-emitting element groups G4, G5, and G6 can be commonalized into the three conductor patterns 354, 355, and 356. In addition, the nine output lines from the cathodes of the light-emitting elements 50R, 50G, and 50B of the light-emitting element groups G7, G8, and G9 can be commonalized into the three conductor patterns 357, 358, and 359.

As described above, thirty six lead wires necessary in the entire module can be reduced into twelve. Therefore, it is possible to individually drive each of the light-emitting elements 50R, 50G, and 50B and facilitate connection between the light-emitting module 10 and an external device.

According to this embodiment, the light-emitting module 10 has the board 30 having flexibility higher than that of the light-emitting panel 20. For this reason, the light-emitting module 10 can be installed in a curved place or the like by bending the board 30. In addition, the board 30 has a structure simpler than that of the light-emitting module 10. For this reason, even when the light-emitting module 10 is installed by bending the board 30, it is possible to maintain reliability of the light-emitting module 10.

In the light-emitting module 10 according to this embodiment, the bumps 57 and 58 of the light-emitting elements 50R, 50G, and 50B of the light-emitting panel 20 are formed only on the upper surface side of the light-emitting elements 50R, 50G, and 50B as illustrated in FIG. 3. For this reason, it is possible to control the light-emitting elements 50R, 50G, and 50B by forming the mesh patterns 201 to 236 connected to the light-emitting elements 50R, 50G, and 50B only on the lower surface of the light transmissive film 21. Therefore, it is possible to secure excellent light transmissive property and flexibility of the light-emitting panel 20 without necessity of forming an interconnect to the light-emitting panel 20 on both the upper and lower surface sides of the light-emitting elements 50R, 50G, and 50B.

According to this embodiment, the mesh patterns 201 to 237 are provided as metallic thin films having a line width of approximately 10 µm. For this reason, it is possible to sufficiently secure light transmissive property and flexibility of the light-emitting module 10.

According to this embodiment, it is assumed that the conductor layer 23 having the connection pads 24P is segmented using the laser light to form the mesh patterns 201 to 237 as illustrated in FIG. 5. Alternatively, the mesh patterns 201 to 237 may be formed through photolithography.

While the embodiments of the invention have been described hereinbefore, they are not intended to limit the scope of the invention. For example, in the aforementioned embodiments, it is assumed that the light-emitting module 10 has nine light-emitting element groups G1 to G9 each having three neighboring light-emitting elements 50R, 50G, and 50B as illustrated in FIG. 1. Alternatively, each of the light-emitting element groups G1 to G9 may include four or more light-emitting elements having a color other than red, green, and blue. Furthermore, the light-emitting module 10 may also include ten or more light-emitting element groups.

In the aforementioned embodiments, it is assumed that each of the light-emitting element groups G1 to G9 of the light-emitting module 10 includes the light-emitting elements 50R, 50G, and 50B emitting red, green, and blue light, respectively. Alternatively, the light-emitting element groups G1 to G9 of the light-emitting module 10 may include the light-emitting elements emitting the same color.

Figure 18:
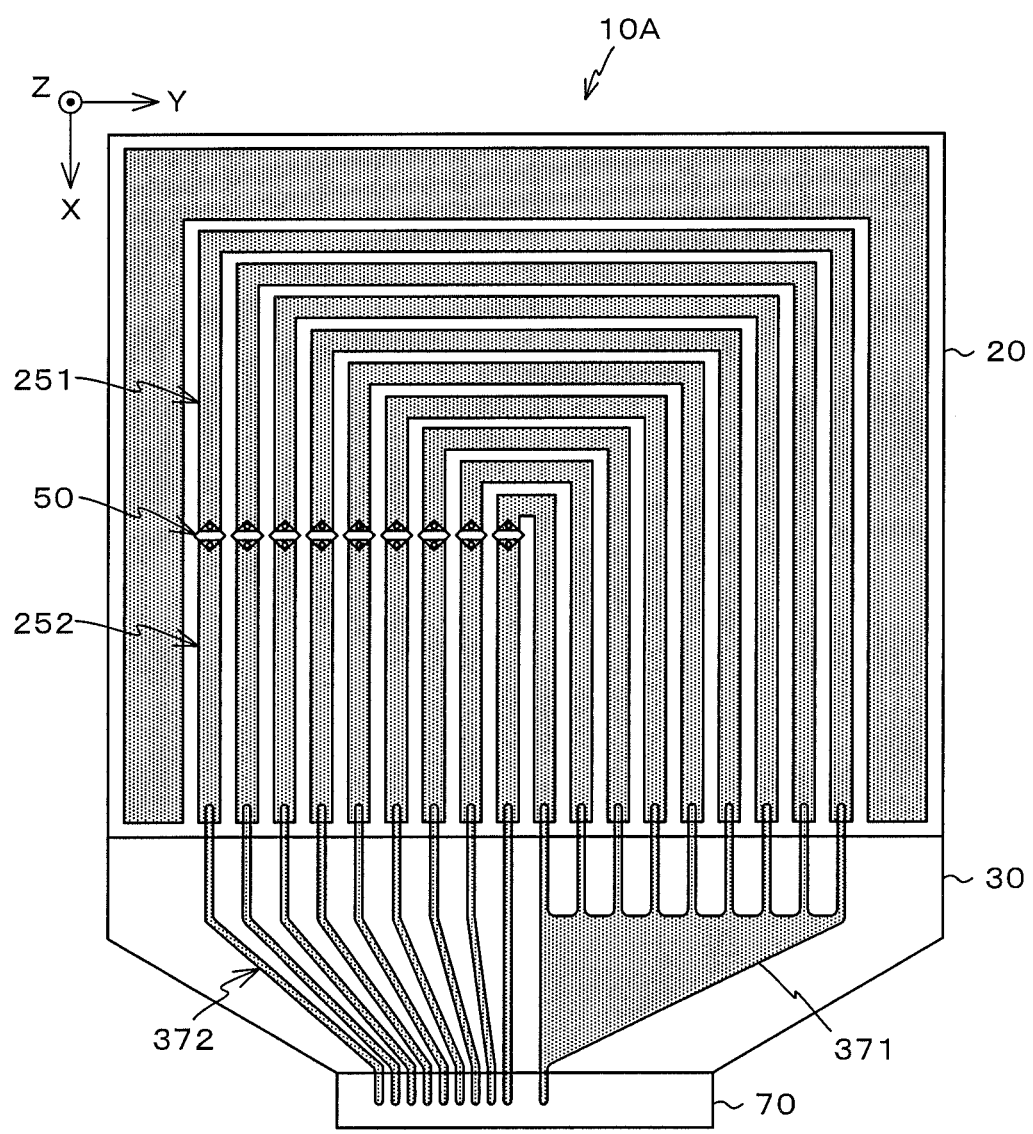
FIG. 18 is a diagram illustrating a modification of the light-emitting module.

In the aforementioned embodiments, it is assumed that a pair of conductor layers 32 and 33 are provided in the board 30 of the light-emitting module 10. Alternatively, a single conductor layer may also be provided in the board 30 depending on the number or arrangement of the light-emitting elements 50 of the light-emitting module 10. FIG. 18 is a diagram illustrating a light-emitting module 10A according to a modification of the embodiment. For example, in a case where the light-emitting elements 50 of the light-emitting module 10 are arranged one-dimensionally along the Y-axis direction between the mesh patterns 251 and 252 as illustrated in FIG. 18, the conductor patterns 371 and 372 may be formed only in one side of the board 30. In this case, each mesh pattern 251 connected to the anode of the light-emitting element 50 is connected to the conductor pattern 371. As a result, compared to a case where a set of bumps 57 and 58 of each light-emitting element 50 are individually connected to the connector 70, it is possible to reduce the number of the conductor patterns connected to the connector 70. Specifically, in a case where the connector 70 is directly embedded in the light-emitting panel 20, it is necessary to provide a connector having eighteen or more terminals. However, according to this embodiment, it is possible to use a connector having ten terminals. Therefore, it is possible to reduce cost of the device and improve reliability of the device.

In the aforementioned embodiments, it is assumed that a pair of conductor layers 32 and 33 are provided in the board 30 of the light-emitting module 10. Alternatively, the board 30 may be a multilayer interconnection board having three or more conductor layers. In addition, the board 30 may be a rigid wiring board having low flexibility instead of the flexible wiring board having flexibility.

In the aforementioned embodiments, it is assumed that the resin layer 24 is formed of sheet-like thermosetting resin 241 and thermoplastic resin 242. Alternatively, for example, paste-like or liquid-phase thermosetting resin 241 and thermoplastic resin 242 may be applied to the light transmissive films 21 and 22, so that the resin layer 24 may be formed of the thermosetting resin 241 and the thermoplastic resin 242.

In the aforementioned embodiments, it is assumed that the resin layer 24 is formed of thermosetting resin 241 and thermoplastic resin 242. Alternatively, the resin layer 24 may be formed of only the thermoplastic resin. In addition, the resin layer 24 may also be formed of only the thermosetting resin.

In the aforementioned embodiments, it is assumed that the conductor layer 23 including the mesh patterns 201 to 237 are formed of a metallic material such as copper (Cu) or silver (Ag). Alternatively, the conductor layer 23 may be formed of a conductive transparent material such as indium tin oxide (ITO) (transparent conductor film). In this case, the mesh patterns 201 to 237 of FIG. 4 are transparent conductor film patterns having a uniform thickness (solid patterns).

In the aforementioned embodiments, it is assumed that the light-emitting elements 50 are one-side two-electrode type light-emitting elements in which a pair of electrodes 55 and 56 are formed on one side. Alternatively, the light-emitting elements 50 may also be both-side electrode type light-emitting elements in which pads are provided on both the upper and lower sides. In this case, the conductor layers are formed on both the light transmissive films 21 and 22 of the light-emitting panel 20.

In the aforementioned embodiments, it is assumed that the conductor layer 23 extracted from the +X side of the light-emitting panel 20 is connected to the board 30 by way of example as illustrated in FIG. 1. Alternatively, the conductor layer 23 may be extracted from the −X-side outer edge of the light-emitting panel 20 or the both-end outer edges of the Y-axis direction and may be connected to the board 30 or the like. Alternatively, an opening penetrating in the Z-axis direction may be provided in the light-emitting panel 20, and the conductor layer 23 may be extracted from this opening and may be connected to the board 30 or the connector 70.

In the aforementioned embodiments, it is assumed that the light-emitting panel 20 and the board 30 are directly connected. Alternatively, the light-emitting panel 20 and the board 30 may be connected by interposing another flexible wiring board or the like.

In the aforementioned embodiments, it is assumed that the conductor layer is formed only in the light transmissive film 21 out of the light transmissive films 21 and 22 of the light-emitting panel 20. Alternatively, the conductor layer may also be provided in the light transmissive film 22. A three-dimensional interconnection can be provided in the light-emitting panel 20 by connecting the conductor layers of the light transmissive films 21 and 22 through a conductive filler. Alternatively, another conductor layer separate from the conductor layer 23 may be provided on the upper surface of the light transmissive film 21, and the conductor layers on both sides of the light transmissive film 21 may be connected to each other through a through-hole, so that a three-dimensional interconnection can be provided in the light-emitting panel 20. Such a multilayer interconnection may be provided in the circumference of the light-emitting panel 20 or inside of the light-emitting panel 20.

In the aforementioned embodiments, it is assumed that a single light-emitting element 50 is connected to a pair of mesh patterns. Alternatively, for example, similar to the light-emitting module 10B of FIG. 19, a plurality of light-emitting elements 50 may also be connected to a pair of mesh patterns 261 and 262.

The light-emitting panel 20 of the light-emitting module 10B has ten light-emitting elements (LEDs) 50 and a pair of mesh patterns 262 and 262 neighbored in the Y-axis direction. Each of the mesh patterns 261 and 262 is formed in a rectangular shape having a longitudinal direction set to the X-axis direction. The mesh patterns 261 and 262 are formed of, for example, copper with a thickness of 2 μm and are line patterns having a line width of approximately 10 μm. The line patterns arranged in parallel with the X-axis are formed with an interval of approximately 300 μm along the Y-axis. Furthermore, the line patterns arranged in parallel with the Y-axis are formed with an interval of approximately 300 μm along the X-axis.

The ten light-emitting elements 50 are arranged across the mesh patterns 261 and 262, and the electrodes 55 and 56 are electrically connected to the mesh patterns 261 and 262.

Figure 19:
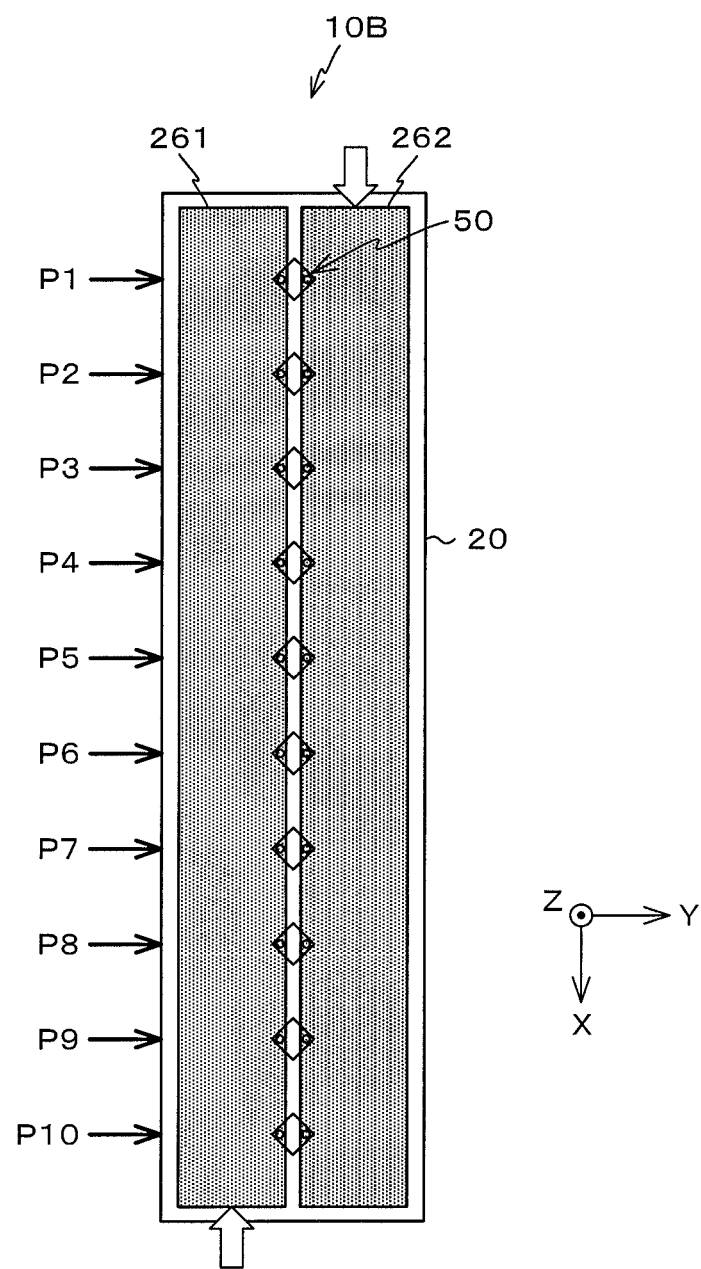
FIG. 19 is a diagram illustrating a modification of the light-emitting module.

In the light-emitting module 10B configured as described above, if a voltage is applied to two places indicated by the white arrows, the light-emitting elements 50 emit light. For example, as illustrated in FIG. 19, as the ten light-emitting elements 50 are connected to the mesh patterns 261 and 262, a distribution of the current value flowing to the light-emitting elements 50 has a change depending on the position of the light-emitting element 50.

Figure 20:
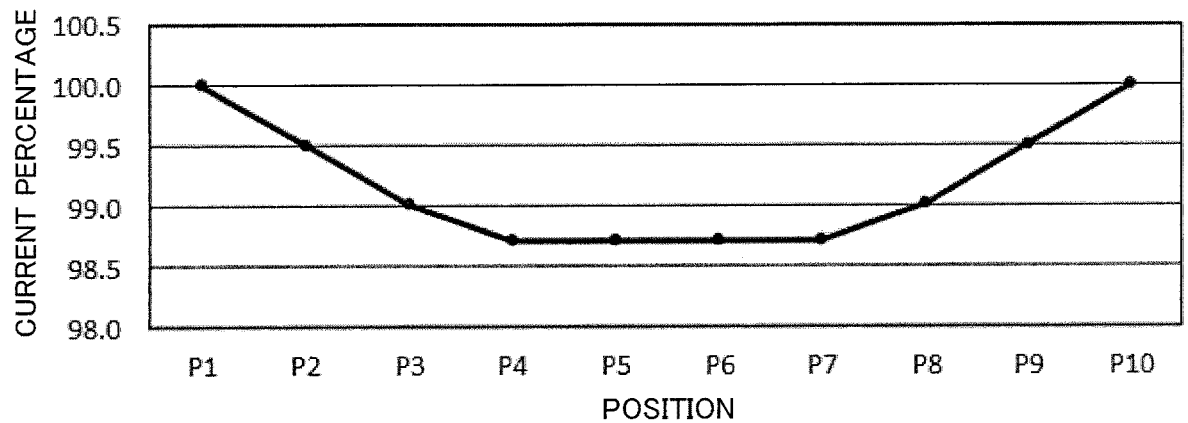
FIG. 20 is a plot illustrating a current distribution of each light-emitting element.

FIGS. 20 to 25 are diagrams illustrating simulation results of the current value distribution. FIG. 20 is a graph illustrating a current distribution of each of the ten light-emitting elements 50. The abscissa refers to positions of the light-emitting elements 50 indicated by the arrows of FIG. 19, and the ordinate refers to a percentage of the current of the light-emitting elements 50 (current value ratio). In a case where the light-emitting elements 50 are connected to the rectangular mesh patterns 261 and 262 in parallel, the currents of the light-emitting elements 50 positioned in the end portions of the mesh patterns 261 and 262 tend to be maximized, and the current of the light-emitting elements 50 positioned in the center tends to be minimized. The simulation result of FIG. 20 shows percentages of the currents of each light-emitting element 50 by setting the positions of the light-emitting elements 50 to P1, P2, . . . , Pn (where "n" denotes a natural number) in the +X direction, and setting the current of the light-emitting element 50 placed in the position P1 to 100% (reference current).

The light-emitting elements 50 of the light-emitting module 10B are arranged at an interval of 3 mm, and a power source of the light-emitting module 10B is set to a constant current source of 60 mA (6 mA×10). In addition, a dimension of the Y-axis direction of each of the mesh patterns 261 and 262 is set to 5.1 mm, and a resistance value of one side of one grid of the mesh pattern is set to 0.21546Ω. In this case, the currents flowing to the light-emitting elements 50 placed in the center positions P5 and P6 of the mesh patterns 261 and 262 are approximately 98.6 to 98.7% of the reference current. There is a difference of approximately 1.3 to 1.4% at maximum in the magnitude of the current among the ten light-emitting elements 50.

Figure 21:
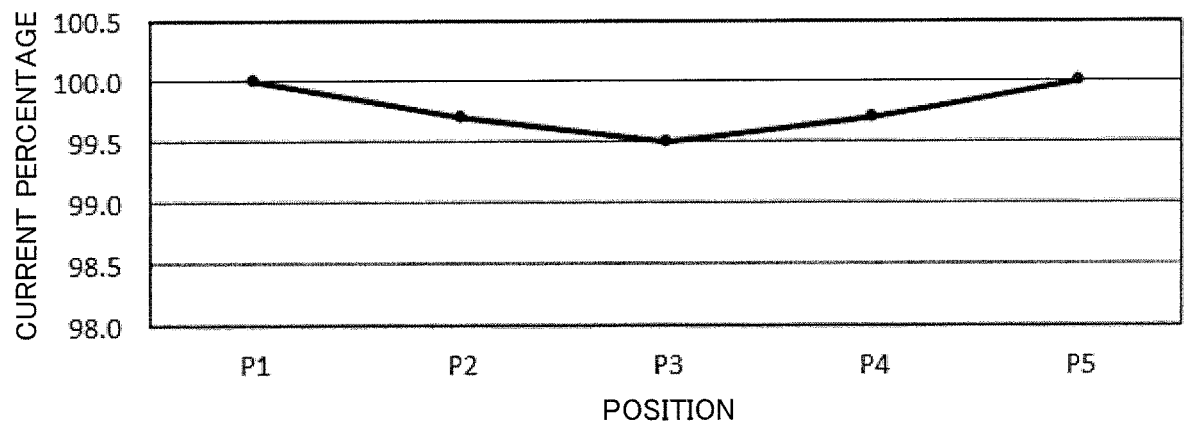
FIG. 21 is a plot illustrating a current distribution of each light-emitting element.

The variation of the current between the light-emitting elements exponentially increases depending on the number of light-emitting elements. For example, FIG. 21 illustrates the current percentages of each light-emitting element 50 when the number of the light-emitting elements 50 of the light-emitting module 10B is set to five. In this case, merely a difference of approximately 0.6% is generated at maximum among the currents of the five light-emitting elements 50.

Figure 22:
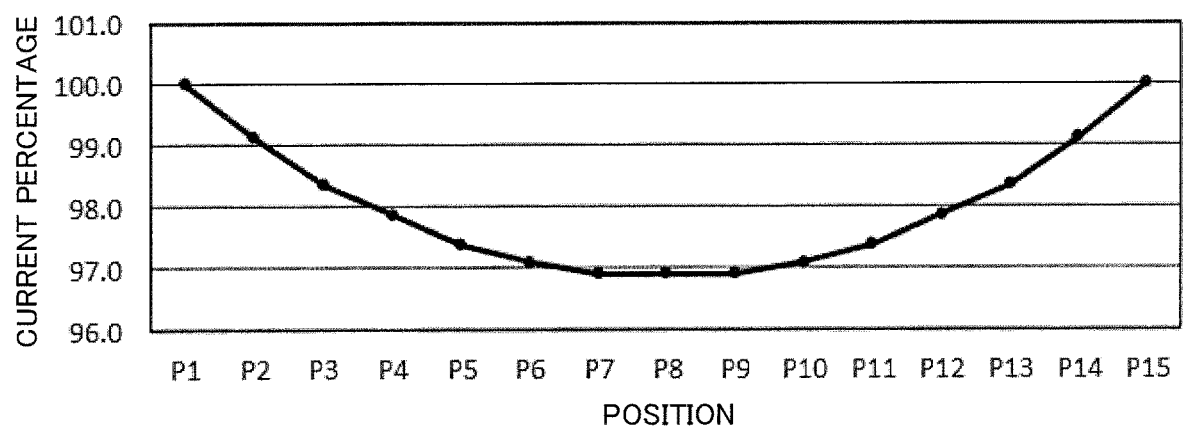
FIG. 22 is a plot illustrating a current distribution of each light-emitting element.
Figure 23:
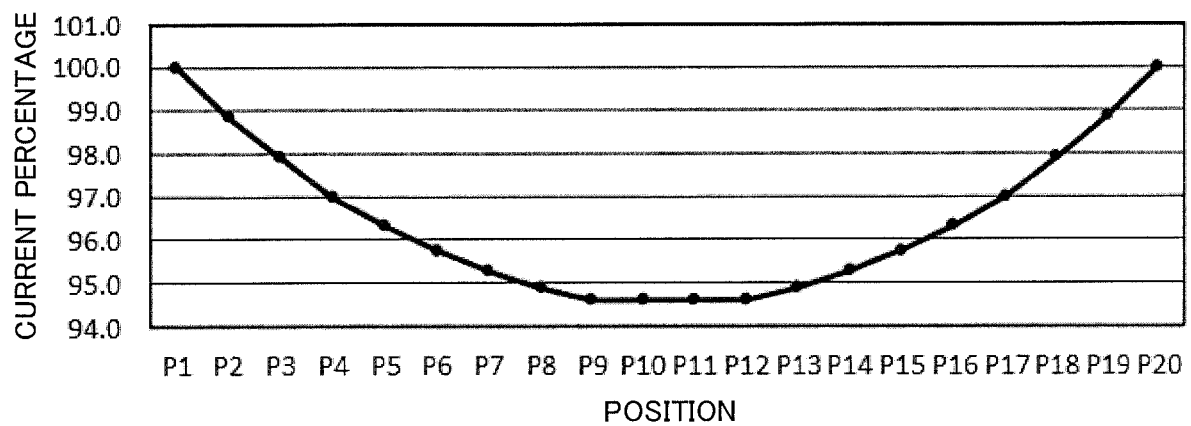
FIG. 23 is a plot illustrating a current distribution of each light-emitting element.
Figure 24:
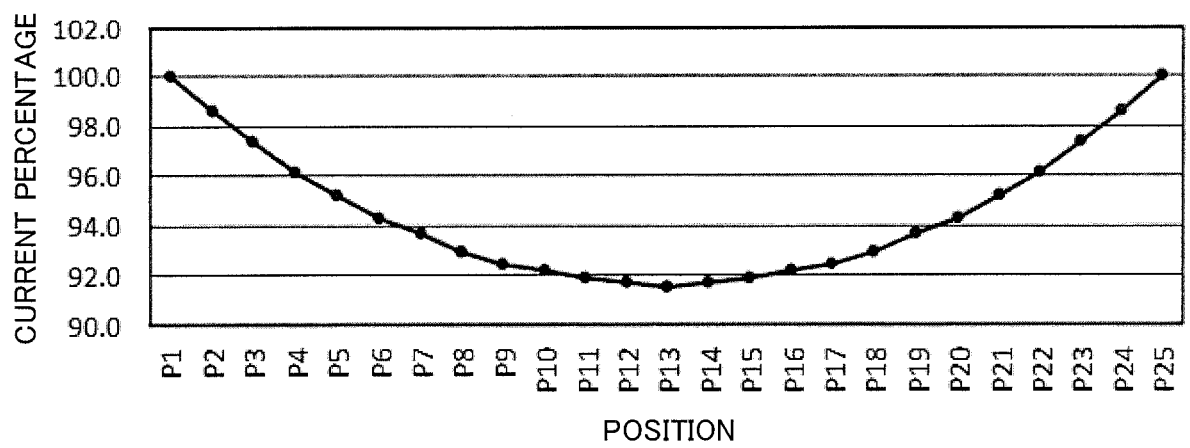
FIG. 24 is a plot illustrating a current distribution of each light-emitting element.

Meanwhile, FIGS. 22 to 24 illustrate the current percentages of each light-emitting element 50 when the number of light-emitting elements 50 of the light-emitting module 10B is set to "fifteen", "twenty", or "twenty five". As illustrated in FIG. 22, when the number of the light-emitting elements 50 is "fifteen", there is a difference of 3% or more at maximum between the currents of the light-emitting elements 50. As illustrated in FIG. 23, when the number of the light-emitting elements 50 is "twenty", there is a difference of 5% or more at maximum between the currents of the light-emitting elements 50. In addition, as illustrated in FIG. 24, when the number of the light-emitting elements 50 is "twenty five", there is a difference of 8% or more at maximum between the currents of the light-emitting elements 50.

As described above, when the magnitude of the current flowing to each light-emitting element is different, the light intensities emitted from each of the light-emitting elements of the light-emitting module become different. As a result, this is viewed to the human eyes as if there is a difference in brightness between the light-emitting elements in a single light-emitting module. For this reason, in the light-emitting module, it is necessary to determine the number of the light-emitting elements connected to a pair of mesh patterns in parallel such that a difference between the currents of each light-emitting element and the reference current (hereinafter, referred to as a "current difference") is equal to or smaller than a predetermined threshold value. The threshold value is determined on the basis of, for example, characteristics of the light-emitting elements, resistances and dimensions of the mesh patterns, a width of the line pattern of the mesh pattern, and the like.

Sensitivity of the light from the light-emitting element is different depending on an observer (examinee) who observes the light-emitting element. In this regard, an experiment was performed for a plurality of persons (about ten persons), in which the light-emitting module having R, G, and B LEDs was observed, for example, at a distance of 40 cm and at a distance of 3 m from a person's face. As a result, if the current variation is equal to or smaller than 3%, most of the persons do not visually recognize the difference of the light intensity. Meanwhile, if the current variation is larger than 3% and equal to or smaller than 5%, a part of the persons visually recognizes the current variation. Therefore, in the light-emitting module, it is preferable to determine the number of the light-emitting elements connected in parallel such that the difference between the current of each light-emitting element and the reference current is equal to or smaller than 5% of the reference current. In addition, it is more preferable to determine the number of light-emitting elements connected in parallel such that the difference between the current of each light-emitting element and the reference current is equal to or smaller than 3% of the reference current.

For example, if the dimension of the Y-axis direction of each of the mesh patterns 261 and 262 is set to 5.1 mm, and the resistance value of one side of one grid of the mesh pattern is set to 0.21546Ω, it is preferable to set the number of the light-emitting elements connected in parallel to "fifteen" or smaller, and more preferably, "ten" or smaller.

Figure 25:
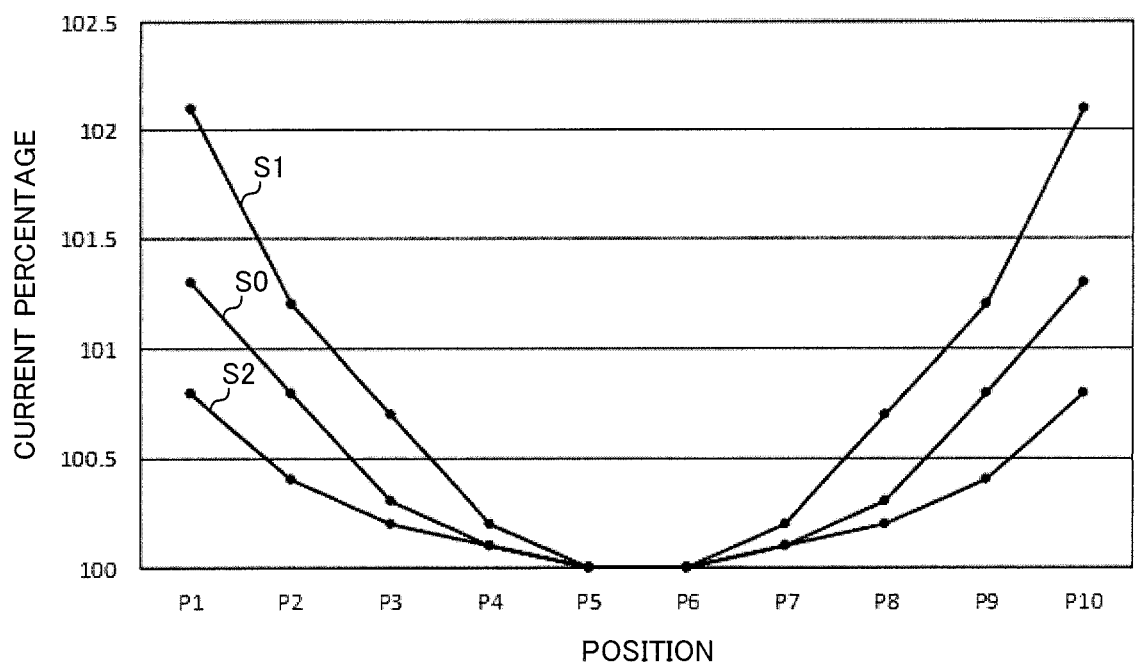
FIG. 25 is a plot illustrating a current distribution of each light-emitting element.

The current variation between the light-emitting elements 50 also changes depending on the sizes or resistance values of the mesh patterns 261 and 262. For example, the curve S0 of FIG. 25 is similar to the curve of FIG. 20. In this case, "R0" denotes the resistance value of the mesh patterns 261 and 262. In addition, the curve S1 indicates the current percentage of each light-emitting element when the resistance value of the mesh patterns 261 and 262 is higher than the resistance value R0 by 50%. Furthermore, the curve S2 indicates the current percentage of each light-emitting element when the resistance value of the mesh patterns 261 and 262 is lower than the resistance value R0 by 50%. As indicated by the curves S0, S1, and S2, the current variation of the light-emitting element depends on the resistance value of the mesh patterns 261 and 262. Therefore, it is necessary to design the light-emitting module by comprehensively considering the number of the light-emitting elements and the resistance value of the mesh pattern.

In FIG. 19, the voltages are applied to the mesh patterns 261 and 262 from two directions indicated by the white arrows. Alternatively, the voltage may also be applied to the mesh patterns 261 and 262 from the same direction. Similarly, even in this case, the current value flowing through the light-emitting element placed in the center is smaller than the current value flowing through the light-emitting elements placed in both ends. In this case, the light-emitting module has a current value distribution indicated by the concave curve of FIG. 20 and the like.

Figure 26:
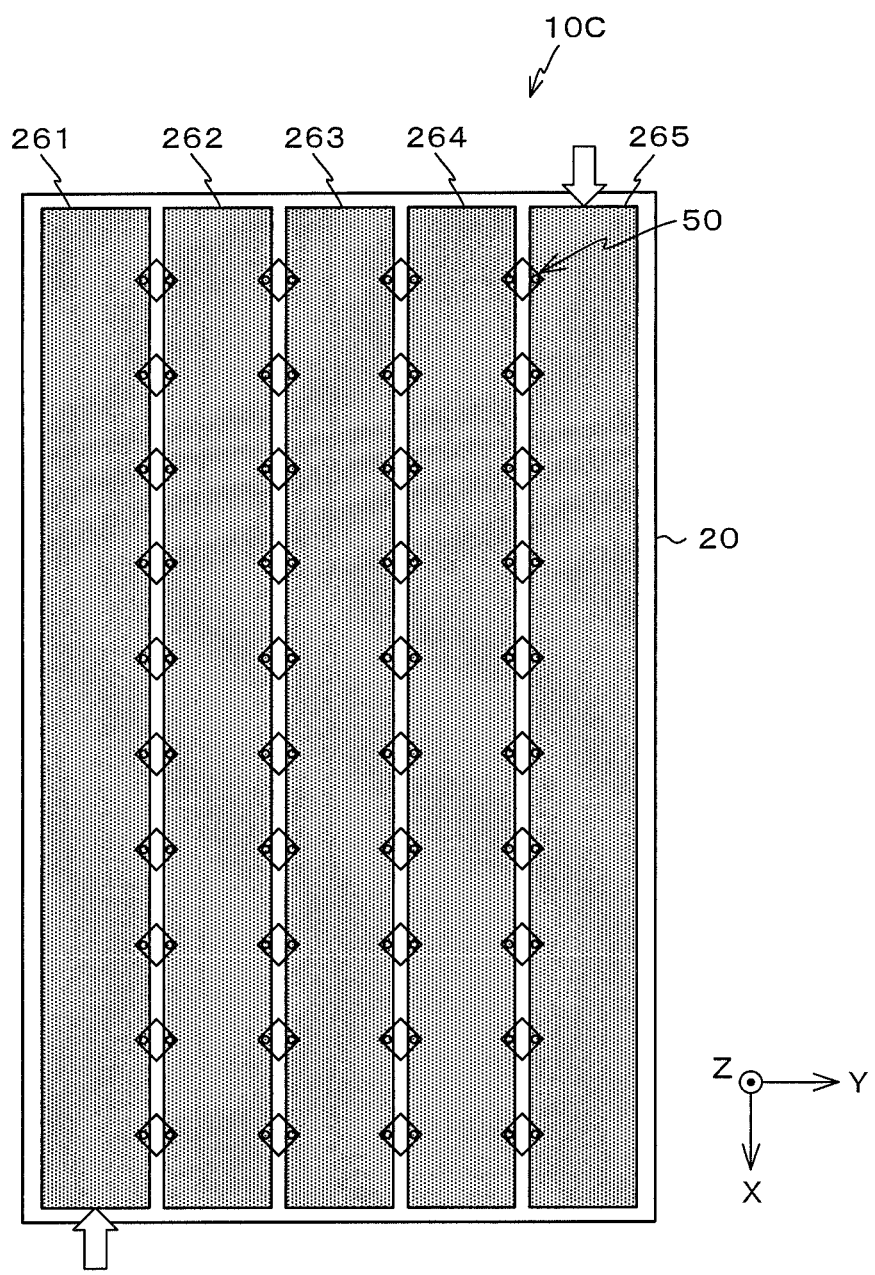
FIG. 26 is a diagram illustrating a modification of the light-emitting module.

In FIG. 19, the light-emitting elements 50 are arranged along a single line (one stage). Alternatively, unlike the structure of FIG. 19, the light-emitting elements 50 may be arranged along a plurality of lines (a plurality of stages). For example, as in the light-emitting module 10C of FIG. 26, a plurality of mesh patterns 261 to 265 may be provided in the light-emitting panel 20, and a plurality of light-emitting elements 50 may be arranged across the neighboring mesh patterns 261 to 265. As a result, it is possible to provide an m-parallel×n-serial matrix type light-emitting element circuit.

In this case, it is possible to turn on the matrix type light-emitting element circuit by applying voltages to the mesh patterns 261 and 265 of both ends of the Y-axis direction. The number of light-emitting element lines (number of stages) may be determined within a range of the power voltage. Alternatively, the number of the light-emitting element lines may be determined depending on the light emission area. Naturally, the light-emitting module 10B of FIG. 19 may be formed by simply connecting the light-emitting elements in series. In either case, the current value has a distribution depending on the number or the positions of the light-emitting elements 50 as illustrated in the concave curves of FIGS. 20 to 25.

The current distribution of the current flowing through the light-emitting elements 50 of the light-emitting module has a concave curve shape. It is necessary to suppress a difference of the current value ΔI (=Imax−Imin) between the current flowing through the light-emitting elements positioned in one end or both ends of the light-emitting module and the current flowing through the light-emitting elements positioned in the center within 10% or smaller. An actual experiment for observers was performed. As a result, it was found that it is preferable to determine the number of the light-emitting elements of the light-emitting module such that the difference ΔI becomes equal to or smaller than 5%. In reality, it is more preferable to determine the number of the light-emitting elements such that the difference ΔI becomes equal to or smaller than 3%, and more preferably, becomes equal to or smaller than 2%. Note that the light emitted from the light-emitting element 50 may have any color of R, G, and B. Furthermore, the color of the light emitted from the light-emitting element 50 may also be white.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting module comprising:
   a light-emitting panel comprising:
      a transparent film having a flexural modulus of approximately 0 to 320 kgf/mm² (excluding zero),
      a conductor layer provided on one surface of the transparent film,
      a plurality of light emitting elements having an electrode connected to the conductor layer, and
      a resin layer that holds the plurality of light emitting elements on the transparent film and has a tensile storage modulus EM of 0.01 to 1000 GPa in a range of 0° C. to 100° C.; and
   a board having flexibility higher than that of the light-emitting panel and comprising:
      a substrate with insulation,
      a plurality of first conductor patterns provided on one surface of the substrate and connected to the conductor layer of the light-emitting panel,
      a plurality of second conductor patterns provided on the other surface of the substrate, extending so as to intersect the plurality of first conductor patterns, and connected to the conductor layer of the light-emitting panel, and
      a plurality of vias for conducting the plurality of first conductor patterns and the plurality of second conductor patterns,
   wherein the plurality of light emitting elements selectively emit light when a voltage is selectively applied to the plurality of first conductor patterns and the plurality of second conductor patterns.

2. The light-emitting module according to claim 1, wherein:
   the plurality of light emitting elements include at least a first light emitting element having a pair of electrodes, and a second light emitting element having a pair of electrodes and emitting light in a different color from the first light emitting element, and
   a common pattern connected to one electrode of each of the first light emitting element and the second light emitting element, and a first pattern connected to the other electrode of the first light emitting element and the second pattern connected to the other electrode of the second light emitting element are constituted by the conductor layer, the first conductor pattern and the second conductor pattern.

3. The light-emitting module according to claim 2, wherein a bump is formed in each of the pair of electrodes of the light emitting elements.

4. The light-emitting module according to claim 2, wherein the board has a connector for connecting the plurality of second conductor patterns to an external device.

5. The light-emitting module according to claim 2, wherein the light emitting elements are arranged two-dimensionally in a matrix shape.

6. The light-emitting module according to claim 2, wherein the plurality of light emitting elements include a plurality of first light emitting elements and a plurality of second light emitting elements that emit light having mutually different colors.

7. The light-emitting module according to claim 6, wherein the plurality of light emitting elements constitute a plurality of light emitting element groups including the first light emitting element and the second light emitting element, and
the plurality of light emitting element groups are arranged two-dimensionally in a matrix shape.

8. The light-emitting module according to claim 2, wherein the conductor layer has a first pattern connected to one of the electrodes of each of the light emitting elements and one of the first conductor patterns, and a second pattern connected to the other electrode of each of the light emitting elements and the one of the first conductor patterns.

9. The light-emitting module according to claim 8, wherein the first conductor pattern and the second conductor pattern are mesh patterns.

10. The light-emitting module according to claim 8, wherein the number of the light emitting elements connected to the first pattern and the second pattern in parallel is determined such that a percentage of a minimum current value of the light emitting element against a maximum current value of the light emitting element becomes equal to or smaller than a threshold value.

11. The light-emitting module according to claim 10, wherein the threshold value is set to 5%.

12. The light-emitting, module according to claim 11, wherein the number of the light emitting elements connected to the first pattern, and the second pattern in parallel is equal to or smaller than 15.

13. A light-emitting module comprising:
a transparent insulating film having a total light transmittance of about 5 to 95% and a flexural modulus of about 0 to 320 kgf/mm² (excluding zero);
a conductor layer provided on one surface of the transparent film;
a plurality of light emitting elements having a pair of electrodes;
a resin layer having, a tensile storage elastic modulus EM in the range of 0° C. to 100° C. of 0.01 to 1000 GPa and holding the plurality of light emitting elements on the transparent film;
a first conductor pattern provided on the transparent insulating film and connecting one electrode of the plurality of light emitting elements in parallel;
a second conductor pattern provided on the transparent insulating film and connecting the other electrodes of the plurality of light emitting elements in parallel,
wherein:
when a voltage is applied to a predetermined position of the first conductor pattern and the second conductor pattern to cause the light emitting elements connected in parallel to emit light, the difference ΔI(=Imax−Imin) between the first current value of the current flowing through the light emitting element at an end portion and the second current value of the current flowing through the light emitting element at a center portion is 5% or less of the first current value, and
when the light emitting device is observed at a distance of about 40 cm or about 3 m, there is almost no difference in light emission intensity between the plurality of light emitting elements.

14. The light-emitting module according to claim 13, wherein the conductor layer has a first pattern connected to one of the electrodes of each of the light emitting elements and the first conductor pattern, and a second pattern connected to the other electrode of each of the light emitting elements and the first conductor pattern.

15. The light-emitting module according to claim 14, wherein the first conductor pattern and the second conductor pattern are mesh patterns.

16. The light-emitting module according to claim 13, wherein a bump is formed in each of the pair of electrodes of each light emitting element.

17. The light-emitting module according to claim 13, wherein the light emitting elements are arranged two-dimensionally in a matrix shape.

18. The light-emitting module according to claim 13, wherein the plurality of light emitting elements include a plurality of first light emitting elements and a plurality of second light emitting elements that emit light having mutually different colors.

19. The light-emitting module according to claim 18, wherein the plurality of light emitting elements constitute a plurality of light emitting element groups including the first light emitting element and the second light emitting element, and
the plurality of light emitting element groups are arranged two-dimensionally in a matrix shape.

20. The light-emitting module according to claim 14, wherein the number of the light emitting elements connected to the first pattern and the second pattern in parallel is determined such that a percentage of a minimum current value of the light emitting element against a maximum current value of the light emitting element becomes equal to or smaller than a threshold value.

21. The light-emitting module according to claim 20, wherein the threshold value is set to 5%.

22. The light-emitting module according to claim 21, wherein the number of the light emitting elements connected to the first pattern and the second pattern in parallel is equal to or smaller than 15.

23. The light-emitting module according to claim 13, wherein the difference ΔI between the first current value of the current flowing through the light emitting element at the end portion and the second current value of the current flowing through the light emitting element at the center portion is 3% or less of the first current value.

24. The light-emitting module according to claim 13, wherein the difference ΔI between the first current value of the current flowing through the light emitting element at the end portion and the second current value of the current flowing through the light emitting element at the center portion is 2% or less of the first current value.

* * * * *